United States Patent
Patel et al.

(10) Patent No.: US 8,712,732 B2
(45) Date of Patent: Apr. 29, 2014

(54) ELECTRICAL EVENT DETECTION DEVICE AND METHOD OF DETECTING AND CLASSIFYING ELECTRICAL POWER USAGE

(75) Inventors: Shwetak N. Patel, Seattle, WA (US); Matthew S. Reynolds, Durham, NC (US); Sidhant Gupta, Seattle, WA (US); Karthik Yogeeswaran, Santa Monica, CA (US)

(73) Assignee: Belkin International, Inc., Playa Vista, CA (US)

( * ) Notice: Subject to any disclaimer, the term of this patent is extended or adjusted under 35 U.S.C. 154(b) by 0 days.

(21) Appl. No.: 13/392,313

(22) PCT Filed: Apr. 26, 2011

(86) PCT No.: PCT/US2011/033992
§ 371 (c)(1),
(2), (4) Date: Feb. 24, 2012

(87) PCT Pub. No.: WO2011/139715
PCT Pub. Date: Nov. 10, 2011

(65) Prior Publication Data
US 2013/0179124 A1    Jul. 11, 2013

Related U.S. Application Data

(63) Continuation-in-part of application No. 12/283,869, filed on Sep. 16, 2008, now Pat. No. 8,094,034.

(60) Provisional application No. 60/973,188, filed on Sep. 18, 2007, provisional application No. 61/328,122, filed on Apr. 26, 2010, provisional application No. 61/426,472, filed on Dec. 22, 2010.

(51) Int. Cl.
*G01R 31/02*    (2006.01)

(52) U.S. Cl.
USPC .............................. 702/190; 340/657; 702/58

(58) Field of Classification Search
USPC ............... 702/60, 61, 62, 65, 66, 75, 77, 188, 702/190, 191, 58; 340/657
See application file for complete search history.

(56) References Cited

U.S. PATENT DOCUMENTS

| | | | |
|---|---|---|---|
| 3,714,516 A | 1/1973 | Howe | |
| 4,612,617 A | 9/1986 | Laplace, Jr. et al. | |

(Continued)

FOREIGN PATENT DOCUMENTS

| | | |
|---|---|---|
| AR | 070667 | 4/2010 |
| CA | 2705528 | 5/2009 |

(Continued)

OTHER PUBLICATIONS

Calwell, C. and Reeder, T., "Power Supplies: A Hidden Opportunity for Energy Savings," NRDC, May 22, 2002, 28 pages.

(Continued)

*Primary Examiner* — John H Le
(74) *Attorney, Agent, or Firm* — Bryan Cave LLP

(57) ABSTRACT

Some embodiments can concern an apparatus configured to detect an electrical state of one or more electrical devices. The one or more electrical devices are coupled to an electrical power infrastructure and generate one or more high-frequency electrical signals on the electrical power infrastructure. The apparatus can include: (a) a processing module configured to run on a processor of a computational unit; and (b) a sensing device configured to be coupled to an electrical outlet. The sensing device can have: (a) a data acquisition receiver configured to receive the one or more high-frequency electrical signals via the electrical outlet and convert the one or more high-frequency electrical signals into one or more first data signals when the sensing device is coupled to the electrical outlet. The electrical outlet can be electrically coupled to the electrical power infrastructure. The sensing device is in communication with the computational unit. The processing module is further configured to identify the electrical state of the one or more electrical devices at least in part using the one or more first data signals. The high-frequency electrical signals comprise electrical signals in the ten kilohertz to three megahertz range. Other embodiments are disclosed.

22 Claims, 17 Drawing Sheets

(56) References Cited

U.S. PATENT DOCUMENTS

| | | | |
|---|---|---|---|
| 4,804,957 | A | 2/1989 | Selph et al. |
| 4,858,141 | A | 8/1989 | Hart et al. |
| 5,276,629 | A | 1/1994 | Reynolds |
| 5,409,037 | A | 4/1995 | Wheeler et al. |
| 5,441,070 | A | 8/1995 | Thompson |
| 5,483,153 | A | 1/1996 | Leeb et al. |
| 5,590,179 | A | 12/1996 | Shincovich et al. |
| 5,635,895 | A | 6/1997 | Murr |
| 5,717,325 | A | 2/1998 | Leeb et al. |
| 5,898,387 | A | 4/1999 | Davis et al. |
| 6,275,168 | B1 | 8/2001 | Slater et al. |
| 6,622,097 | B2 | 9/2003 | Hunter |
| 6,728,646 | B2 | 4/2004 | Howell et al. |
| 6,734,806 | B1 | 5/2004 | Cratsley |
| 6,816,078 | B2 | 11/2004 | Onoda et al. |
| 6,839,644 | B1 | 1/2005 | Woods et al. |
| 6,853,291 | B1 | 2/2005 | Aisa |
| 6,906,617 | B1 | 6/2005 | Van der Meulen |
| 6,910,025 | B2 | 6/2005 | Cao |
| 6,993,417 | B2 | 1/2006 | Osann et al. |
| 7,019,666 | B2 | 3/2006 | Tootoonian Mashhad et al. |
| 7,043,380 | B2 | 5/2006 | Rodenberg, III et al. |
| 7,049,976 | B2 | 5/2006 | Hunt et al. |
| 7,134,568 | B2 | 11/2006 | Moriyama et al. |
| 7,174,260 | B2 | 2/2007 | Tuff et al. |
| 7,276,915 | B1 | 10/2007 | Euler et al. |
| 7,330,796 | B2 | 2/2008 | Addink et al. |
| 7,400,986 | B2 | 7/2008 | Latham et al. |
| 7,460,930 | B1 | 12/2008 | Vinson et al. |
| 7,493,221 | B2 | 2/2009 | Caggiano et al. |
| 7,498,935 | B2 | 3/2009 | Kodama et al. |
| 7,508,318 | B2 | 3/2009 | Casella et al. |
| 7,541,941 | B2 | 6/2009 | Bogolea et al. |
| 7,546,214 | B2 | 6/2009 | Rivers, Jr. et al. |
| 7,589,942 | B2 | 9/2009 | Kumfer et al. |
| 7,612,971 | B2 | 11/2009 | Premerlani et al. |
| 7,656,649 | B2 | 2/2010 | Loy et al. |
| 7,692,555 | B2 | 4/2010 | Stanley et al. |
| 7,693,670 | B2 | 4/2010 | Durling et al. |
| 7,702,421 | B2 | 4/2010 | Sullivan et al. |
| 7,705,484 | B2 | 4/2010 | Horst |
| 7,706,928 | B1 | 4/2010 | Howell et al. |
| 7,719,257 | B2 | 5/2010 | Robarge et al. |
| 7,729,993 | B2 | 6/2010 | Baraty |
| 7,747,357 | B2 | 6/2010 | Murdoch |
| 7,885,917 | B2 | 2/2011 | Kuhns et al. |
| 7,889,061 | B2 | 2/2011 | Endo |
| 8,078,431 | B2 | 12/2011 | Brown |
| 8,094,034 | B2 | 1/2012 | Patel et al. |
| 8,334,784 | B2 * | 12/2012 | Patel et al. ............ 340/657 |
| 2001/0003286 | A1 | 6/2001 | Philippbar et al. |
| 2003/0050737 | A1 | 3/2003 | Osann et al. |
| 2003/0088527 | A1 | 5/2003 | Hung et al. |
| 2004/0128034 | A1 | 7/2004 | Lenker et al. |
| 2004/0140908 | A1 | 7/2004 | Gladwin et al. |
| 2004/0206405 | A1 | 10/2004 | Smith et al. |
| 2005/0067049 | A1 | 3/2005 | Fima et al. |
| 2006/0103549 | A1 | 5/2006 | Hunt et al. |
| 2007/0114987 | A1 | 5/2007 | Kagan |
| 2008/0086394 | A1 | 4/2008 | O'Neil et al. |
| 2008/0091345 | A1 | 4/2008 | Patel et al. |
| 2008/0167755 | A1 | 7/2008 | Curt |
| 2008/0255782 | A1 | 10/2008 | Bilac et al. |
| 2009/0043520 | A1 | 2/2009 | Pollack et al. |
| 2009/0072985 | A1 | 3/2009 | Patel et al. |
| 2010/0030393 | A1 | 2/2010 | Masters et al. |
| 2010/0070214 | A1 | 3/2010 | Hyde et al. |
| 2010/0070218 | A1 | 3/2010 | Hyde et al. |
| 2010/0109842 | A1 | 5/2010 | Patel et al. |
| 2010/0148579 | A1 | 6/2010 | Maloney |
| 2010/0188262 | A1 | 7/2010 | Reymann et al. |
| 2011/0004421 | A1 | 1/2011 | Rosewell et al. |

FOREIGN PATENT DOCUMENTS

| | | |
|---|---|---|
| CN | 101523226 | 9/2009 |
| CN | 101535819 | 9/2009 |
| CN | 101680676 | 3/2010 |
| DE | 102007032053 | 1/2009 |
| EP | 1136829 | 9/2001 |
| EP | 1444527 | 4/2004 |
| EP | 2171363 | 4/2010 |
| EP | 2174395 | 4/2010 |
| EP | 2188879 | 5/2010 |
| FR | 2645968 | 10/1990 |
| GB | 2461915 | 1/2010 |
| GB | 2465800 | 2/2010 |
| GB | 2464634 | 4/2010 |
| GB | 2464725 | 5/2010 |
| GB | 2465367 | 5/2010 |
| KR | 20090057058 | 6/2009 |
| KR | 20090057071 | 6/2009 |
| KR | 2010021458 | 2/2010 |
| KR | 20100021604 | 8/2011 |
| WO | WO9304377 | 3/1993 |
| WO | WO03/003029 | 1/2003 |
| WO | WO2008042483 | 4/2008 |
| WO | WO2008153576 | 12/2008 |
| WO | WO2008153577 | 12/2008 |
| WO | WO2009040140 | 4/2009 |
| WO | WO2009063397 | 5/2009 |
| WO | WO2009081407 | 7/2009 |
| WO | WO2010007369 | 1/2010 |
| WO | WO2010062398 | 6/2010 |

OTHER PUBLICATIONS

Fogarty, J., Au, C. and Hudson, S., "Sensing from the Basement: A Feasibility Study of Unobtrusive and Low-Cost Home Activity Recognition," In the Proceedings of ACM Symposium on User Interface Software and Technology (UIST'06), Oct. 15-18, 2006, 10 pages.

Rosenblat, L., "The Basic Power Supply Tutorial: Design Concepts, Block Diagram, Theory of Operation," http://www.smps.us/power-supply.html, Jun. 8, 2010, 3 pages.

Hart, G., "Nonintrusive Appliance Load Monitoring," In the Proceedings of the IEEE, Dec. 1992, pp. 1870-1891.

Product Data sheet for UBA2021 630 V driver IC for CFL and TL lamps, NXP Semiconductors, Jul. 25, 2008, 16 pages.

P3 International. "Kill a Watt™, Electricity Usage Monitor", Innovative Electronic Solutions, http://www.p3international.com/products/special/P4400/P4400-CE.html, 2008, 1 page.

Compliance Certification Services (Shenzhen) Inc., "FCC Class B Compliance Report," prepared for Jet Way Information Co., Ltd., Dec. 29, 2006, 20 pages.

Kim, Y., Schmid, T., Charbiwala, Z.M., and Srivastava, M.B., "ViridiScope: Design and Implementation of a Fine Grained Power Monitoring System for Homes," In the Proceedings of UbiComp, Sep. 30, 2009, 10 pages.

Lifton, J., Feldmeier, M., Ono, Y., Lewis, C., and Paradiso, J.A., "A Platform for Ubiquitous Sensor Deployment in Occupational and Domestic Environments," In the Proceedings of the 6th International Conference on Information Processing in Sensor Networks, Apr. 25, 2007, pp. 119-127.

Rubner, J., "Tech Professor Developing Camera Cloak," Atlanta Business Chronicle, Jun. 15, 2007, 2 pages.

Murph, D., "Electrical Noise Could Help Automate Your Home," Engadget, Sep. 12, 2007, 4 pages.

Kleiner, K., "Smart Homes' Could Track Your Electrical Noise," New Scientist, Sep. 10, 2007, 2 pages.

"Study Finds Elder Care a Growing Emotional and Financial Burden for Baby Boomers," New ADT monitoring service for elderly helps ease the stress of long distance care giving. PR Newswire Europe, Mar. 29, 2005, 4 pages.

Burges, C., "A Tutorial on Support Vector Machines for Pattern Recognition," Journal of Data Mining and Knowledge Discovery, Jun. 1998, pp. 121-167, vol. 2, Kluwer Academic Publishers, Hingham, MA.

(56) References Cited

OTHER PUBLICATIONS

Chen, J., Kam, A., Zhang, J., Liu, N., and Shue, L., "Bathroom Activity Monitoring Based on Sound," Pervasive Computing, 2005, pp. 47-61.
Howell, E.K., "How Switches Produce Electrical Noise," IEEE Transactions on Electromagnetic Compatibility, Aug. 1979, pp. 162-170, vol. EMC-21, No. 3.
Weka 3—Data Mining with Open Source Machine Learning Software in Java, "Weka 3: Data Mining Software in Java," http://www.cs.waikato.ac.nz/ml/weka/, Mar. 2006, 1 page.
HomePlug Powerline Alliance, web.archive.org/web/20060225110208/www.homeplug.org/en/products/index.asp, 2006, 1 page.
Abowd, G., and Mynatt, E.D., "Charting Past, Present, and Future Research in Ubiquitous Computing," ACM Transactions on Computer-Human Interaction, Mar. 2000, pp. 29-58, vol. 7, No. 1.
Edwards, W.K., and Grinter, R.E., "At Home with Ubiquitous Computing: Seven Challenges," In the Proceedings of UbiComp 2001, Sep. 30-Oct. 2, 2001, 17 pages.
Crabtree, A., Rodden, T., Hemmings, T., and Benford, S., "Finding a Place for UbiComp in the Home," In the Proceedings of UbiComp 2003, Oct. 12-15, 2003, pp. 208-226, Seattle, Washington.
Crabtree, A., and Rodden, T., "Domestic Routines and Design for the Home," Computer Supported Cooperative Work: The Journal of Collaborative Computing, Kluwer Academic Publishers, 2004, 40 pages, vol. 13 (2).
Hemmings, T., Crabtree, A., Rodden, T., Clarke, K., and Rouncefield, M., "Probing the Probes," Proceedings of the 7th Biennial Participatory Design Conference, Jun. 23-25, 2002, pp. 42-50, Malmö, Sweden.
Intille, S.S., Tapia, E.M., Rondoni, J., Beaudin, J., Kukla, C., Agrawal, S., Bao, L., and Larson, K., "Tools for Studying Behavior and Technology in Natural Settings," In the Proceedings of Ubicomp 2003, pp. 157-174, vol. LNCS 2864, A.K. Dey, A. Schmidt, and J.F. McCarthy, Eds. Berlin Heidelberg: Springer.
Aipperspach, R., Rattenbury, T., Woodruff, A., and Canny, J., "A Quantitative Method for Revealing and Comparing Places in the Home," In the Proceedings of UbiComp 2006, Sep. 2006, pp. 1-18, Orange County, CA.
Aipperspach, R., Woodruff, A., Anderson, K., and Hooker, B., "Maps of Our Lives: Sensing People and Objects Together in the Home," EECS Department, University of California, Berkeley, Nov. 30, 2005, pp. 1-11.
Elliot, K., Neustaedter, C., and Greenberg, S., "Time, Ownership and Awareness: The Value of Contextual Locations in the Home," In the Proceedings of UbiComp (Proceedings of the 7th International Conference on Ubiquitous Computing, Tokyo, Japan), Sep. 11-14, 2005, p. 251-268.
O'Brien, J., Rodden, T., Rouncefield, M., and Hughes, J., "At Home with the Technology: An Ethnographic Study of a Set-Top-Box Trial," ACM Transactions on Computer-Human Interaction, Sep. 1999, pp. 282-308, vol. 6, No. 3.
Mainwaring, S.D., and Woodruff, A., "Investigating Mobility, Technology, and Space in Homes, Starting with 'Great Rooms'," In the Proceedings of EPIC 2005, Nov. 14-15, 2005, pp. 188-195.
Philipose, M., Fishkin, K.P., Perkowtiz, M., Patterson, D.J., Fox, D., Kautz, H., and Hähnel, D., "Inferring Activities from Interactions with Objects," IEEE Pervasive Computing, Oct.-Dec. 2004, pp. 10-17, vol. 3, Issue 4.
Patel, S.N., Troung, K.N., and Abowd, G.D., "PowerLine Positioning: A Practical Sub-Room-Level Indoor Location System for Domestic Use," In the Proceedings of UbiComp 2006, pp. 441-458, Orange County, CA.
Patel, S.N., "Bringing Sensing to the Masses: An Exploration in Infrastructure-Mediated Sensing" (slides and transcript of presentation), Intel Labs, Apr. 28, 2008, 133 pages, Seattle, Washington.
Patel, S., Gupta, S., and Reynolds, M., "End-User-Deployable Whole House Contact-Less Power Consumption Sensing," UbiComp 2009, Sep. 30, 2009, 4 pages, Orlando, Florida.

Mountain, D., "SUMMARY The Impact of Real-Time Feedback on Residential Electricity Consumption: The Hydro One Pilot," Mar. 2006, 4 pages.
Darby, S., "Making it Obvious: Designing Feedback into Energy Consumption," Proceedings of the Second International Conference on Energy Efficiency in Household Appliances and Lighting, 2000, 11 pages.
Froehlich, J.E., "Sensing and Feedback of Everyday Activities to Promote Environmentally Sustainable Behaviors," Thesis Proposal, Computer Science & Engineering, University of Washington, Jul. 23, 2009, 35 pages, Seattle, Washington.
Brandon, G. and Lewis, A., "Reducing Household Energy Consumption: A Qualitative and Quantitative Field Study," Journal of Environmental Psychology, Mar. 1999, pp. 75-85, Academic Press, vol. 19, No. 1.
Parker, D., Hoak, D., and Cummings, J., "Contract Report: Pilot Evaluation of Energy Savings from Residential Energy Demand Feedback Devices," Florida Solar Energy Center, A Research Institute of the University of Central Florida, Jan. 2008, 32 pages.
Ueno, T., Inada, R., Saeki, O., and Tsuji, K., "Effectiveness of Displaying Energy Consumption Data in Residential Houses—Analysis on How the Residents Respond," ECEEE 2005 Summer Study—What Works and Who Delivers?, May-Jun. 2005, pp. 1289-1299, France.
Arvola, A., Uutela, A., and Anttila, U., "Billing Feedback as Means to Encourage Household Electricity Conservation: A Field experiment in Helsinki," Proceedings of the 1993 Summer Study of the European Council for Energy Efficient Economy, Jun. 2-7, 2003, pp. 11-21, Saint-Raphaël, France.
Darby, S., "The Effectiveness of Feedback on Energy Consumption," Environmental Change Institute, University of Oxford, Apr. 2006, pp. 1-21.
Fischer, C., "Feedback on Household Electricity Consumption: A Tool for Saving Energy?," Energy Efficiency (2008), Mar. 28, 2008, pp. 79-104.
Froehlich, J., Everitt, K., Fogarty, J., Patel, S., and Landay, J., "Sensing Opportunities for Personalized Feedback Technology to Reduce Consumption," DUB Institute, Department of Computer Science and Engineering, University of Washington, CHI Sustainability Workshop, In the extended proceedings of CHI 2009, 2009, 7 pages.
Mountain, D.C., "Price Influences Demand," DeGroote School of Business, McMaster University, Jun. 5, 2008, 16 pages.
Horst, G.R., "Project Report: Energy Monitoring System," Whirlpool Corporation, Woodridge Energy Study & Monitoring Pilot, 2006, 99 pages.
Patel, S.N., Reynolds, M.S., and Abowd, G.D., "Detecting Human Movement by Differential Air Pressure Sensing in HVAC System Ductwork: An Exploration in Infrastructure Mediated Sensing," In the Proceedings of Pervasive 2008, May 19-22, 2008, pp. 1-16, Sydney, Australia.
Beckman, C., Consolvo, S., and LaMarca, A., "Some Assembly Required: Supporting End-User Sensor Installation in Domestic Ubiquitous Computing Environments," UbiComp 2004: Ubiquitous Computing: 6th International Conference, Sep. 7-10, 2004, pp. 107-124, Nottingham, UK.
Bian, X., Abowd, G.D., and Rehg, J.M., "Using Sound Source Localization to Monitor and Infer Activities in the Home," In the Proceedings of the Third International Conference on Pervasive Computing, May 8-13, 2005, 16 pages, Munich, Germany.
Patel, S.N., Robertson, T., Kientz, J.A., Reynolds, M.S., and Abowd, G.D., "At the Flick of a Switch: Detecting and Classifying Unique Electrical Events on the Residential Power Line," In the Proceedings of UbiComp 2007, Sep. 16, 2007, pp. 271-288, Innsbruck, Austria.
Hirsch, T., Forlizzi, J., Hyder, E., Goetz, J., Stroback, J., and Kurtz, C., "The ELDer Project: Social, Emotional, and Environmental Factors in the Design of Eldercare Technologies," Conference on Universal Usability 2000, Nov. 16-17, 2000, pp. 72-79, Arlington, Virginia.
Koile, K., Tollmar, K., Demirdjian, D., Shrobe, H., and Darrell, T., "Activity Zones for Context-Aware Computing," Proceedings of UbiComp 2003, Oct. 12-15, 2003, pp. 90-106.

(56) References Cited

OTHER PUBLICATIONS

Tapia, E., Intille, S., Lopez, L., and Larson, K., "The Design of a Portable Kit of Wireless Sensors for Naturalistic Data Collection," Proc. of Pervasive 2006, pp. 117-134.

Wilson, D., and Atkeson, C., "Simultaneous Tracking and Activity Recognition (STAR) Using Many Anonymous, Binary Sensors," In the Proceedings of Pervasive 2005, pp. 62-79.

Froehlich, et al., "Hydro-Sense: Infrastructure-Mediated Single-Point Sensing of Whole-Home Water Activity," In Proc. of UbiComp 2009, Sep.-Oct. 2009, pp. 235-244, Florida.

Abbott, R. and Hadden, S., "Product Specification for a Nonintrusive Appliance Load Monitoring System," EPRI Report #NI-101, Aug. 1990.

Hart, G., "Advances in Nonintrusive Appliance Load Monitoring," Proc. of EPRI Information and Automation Conference, Jun. 1991, pp. 1870-1891.

Iachello, G., and Abowd, G., "Privacy and Proportionality: Adapting Legal Evaluation Techniques to Inform Design in Ubiquitous Computing," Proc. of CHI, 2005, pp. 91-100.

Mitchell, T., "Machine Learning," McGraw Hill, 1997.

Marubayashi, G., "Noise Measurements of the Residential Power Line," Proc. of Int'l. Symposium on Power Line Communications, 1997, pp. 104-106.

Rowan, J., and Mynatt, E.D., "Digital Family Portrait Field Trial: Support for Aging in Place," Proc. of ACM Conference (CHI 2005), Apr. 2005, pp. 521-630.

Paradiso, J.A., "Some Novel Applications for Wireless Inertial Sensors," Proc. of NSTI—Nanotech 2006, May 2006, pp. 431-434, Boston, MA.

Drenker, S., and Kader, A., "Nonintrusive Monitoring of Electrical Loads," IEEE Computer Applications in Power, Oct. 1999, pp. 47-51, vol. 12, No. 4.

Murata, H., and Onoda, T., "Estimation of Power Consumption for Household Electric Appliances," 9th Int'l Conf. on Neural Information Processing, Nov. 2002, 5 pages.

Prudenzi, A., "A Neuron Nets Based Procedure for Identifying Domestic Appliances Pattern-of-Use from Energy Recordings at Meter Panel," IEEE, 2002, pp. 941-945, vol. 2.

Laughman, C., Lee, K., Cox, R., Shaw, S., Leeb, S., Norford, L., and Armstrong, P., "Power Signature Analysis," Power and Energy Magazine, IEEE, Mar.-Apr. 2003, pp. 56-63.

Tapia, E., et al., "Activity Recognition in the Home Setting Using Simple and Ubiquitous Sensors," Pervasive Computing (Lecture Notes in Computer Science), 2004, pp. 158-175.

ISR and Written Opinion for corresponding Int'l Application No. PCT/US11/033992 dated Dec. 26, 2011.

\* cited by examiner

| Home | No. of Events | 10 Fold Cross Validation (%) | | Minimal Training Set |
|---|---|---|---|---|
| | | As is | Combined | |
| H1 | 135 | 96.29 | 96.29 | 93.46 |
| H2 | 203 | 89.65 | 89.65 | 83.73 |
| H3 | 170 | 96.47 | 96.47 | 93.52 |
| H4 | 108 | 97.23 | 97.23 | 93.81 |
| H5 | 198 | 85.35 | 92.42* | 90.53 |
| H6 | 404 | 84.41 | 91.83* | 84.61 |
| H7 | 1358 | 92.85 | 92.85 | 85.13 |
| Total | 2576 | 91.75 | 93.82 | 89.25 |

FIG. 14

| ID | Style/Built/Remodeled | Size/Floors | No. of Test Devices |
|---|---|---|---|
| H1 | Apartment/1985/NA | 750 sq. ft./ 1 flr. | 10 |
| H2 | Single Family/2003/NA | 3000 sq. ft./ 2 flrs. | 15 |
| H3 | Single Family/1974/2009 | 1200 sq. ft./ 2 flrs. + basement | 13 |
| H4 | Apartment/1910/NA | 450 sq. ft./ 1 flr. | 7 |
| H5 | Single Family/1960/NA | 1700 sq. ft./ 1 flr. | 13 |
| H6 | Single Family/1926/2003 | 2800 sq. ft./ 2 flrs. + basement | 20 |
| H7 | Apartment/2009/NA | 657 sq. ft./ 1 flr. | 16 |

FIG. 13

| Home | 10 Fold Cross Validation (%) || Minimal Training Set |
|---|---|---|---|
| | As is | Combined | |
| H1 | 96.29 | 96.29 | 93.46 |
| H2 | 89.65 | 89.65 | 83.73 |
| H3 | 96.47 | 96.47 | 93.52 |
| H4 | 97.23 | 97.23 | 93.81 |
| H5 | 85.35 | 92.42* | 90.53 |
| H6 | 84.41 | 91.83* | 84.61 |
| H7 | 92.85 | 92.85 | 85.13 |
| Total | 91.75 | 93.82 | 89.25 |

| Device | 10 Fold Cross Validation (%) |
|---|---|
| Camera Charger | 100 |
| Laptop | 87.5 |
| 23W CFL Lamp | 100 |
| 12W CFL Lamp | 100 |
| Aggregate | 96.87 |

1700

1800

1900

2000

ELECTRICAL EVENT DETECTION DEVICE AND METHOD OF DETECTING AND CLASSIFYING ELECTRICAL POWER USAGE

CROSS-REFERENCE TO RELATED APPLICATIONS

This application is a national stage application under 35 U.S.C. 371 of and claims priority to International Application No. PCT/US11/33992, filed Apr. 26, 2011. This application is also a continuation-in-part of and claims the benefit of U.S. application Ser. No. 12/283,869 filed Sep. 16, 2008, which claims priority to U.S. Provisional Application No. 60/973,188, filed Sep. 18, 2007. International Application No. PCT/US11/33992 also claims priority to U.S. Provisional Application No. 61/328,122, filed Apr. 26, 2010 and U.S. Provisional Application No. 61/426,472, filed Dec. 22, 2010. International Application No. PCT/US11/33992, U.S. application Ser. No. 12/283,869, U.S. Provisional Application No. 60/973,188, U.S. Provisional Application No. 61/328,122, and U.S. Provisional Application No. 61/426,472 are incorporated herein by reference.

FIELD OF THE INVENTION

This invention relates generally to electrical devices, and relates more particularly to electrical event detection devices and methods of detecting and classifying electrical power usage.

DESCRIPTION OF THE BACKGROUND

Many current approaches for detecting and classifying electrical appliance activation use a distributed model wherein each electrical device has a dedicated sensor, which looks for changes in the device's state (e.g., the turning-on and turning-off of the device). Device level sensing is conceptually straightforward, but requires time-consuming and expensive installation and maintenance. Indirect sensing techniques have also been used where microphones, accelerometers, and video cameras are placed throughout a structure to detect electrical appliance activity. Such techniques are effective, but require costly installation and maintenance and may also raise privacy concerns in a home setting. For example, one technique for electrical event detection involves indirectly listening to the activation of switches and motors through microphones distributed throughout a living space.

Accordingly, a need or potential for benefit exists for an apparatus or method that can provide detailed information about the electrical state of electrical devices in a home or other structure but also is relatively inexpensive to deploy and does not require professional installation.

BRIEF DESCRIPTION OF THE DRAWINGS

To facilitate further description of the embodiments, the following drawings are provided in which:

FIG. 13 illustrates a table of demographic data for structures used in an exemplary deployment of an exemplary electrical event detection device, according to an embodiment;

FIG. 14 illustrates a table showing the performance of an exemplary electrical event detection system during an exemplary deployment, according to an embodiment;

Figure 1:
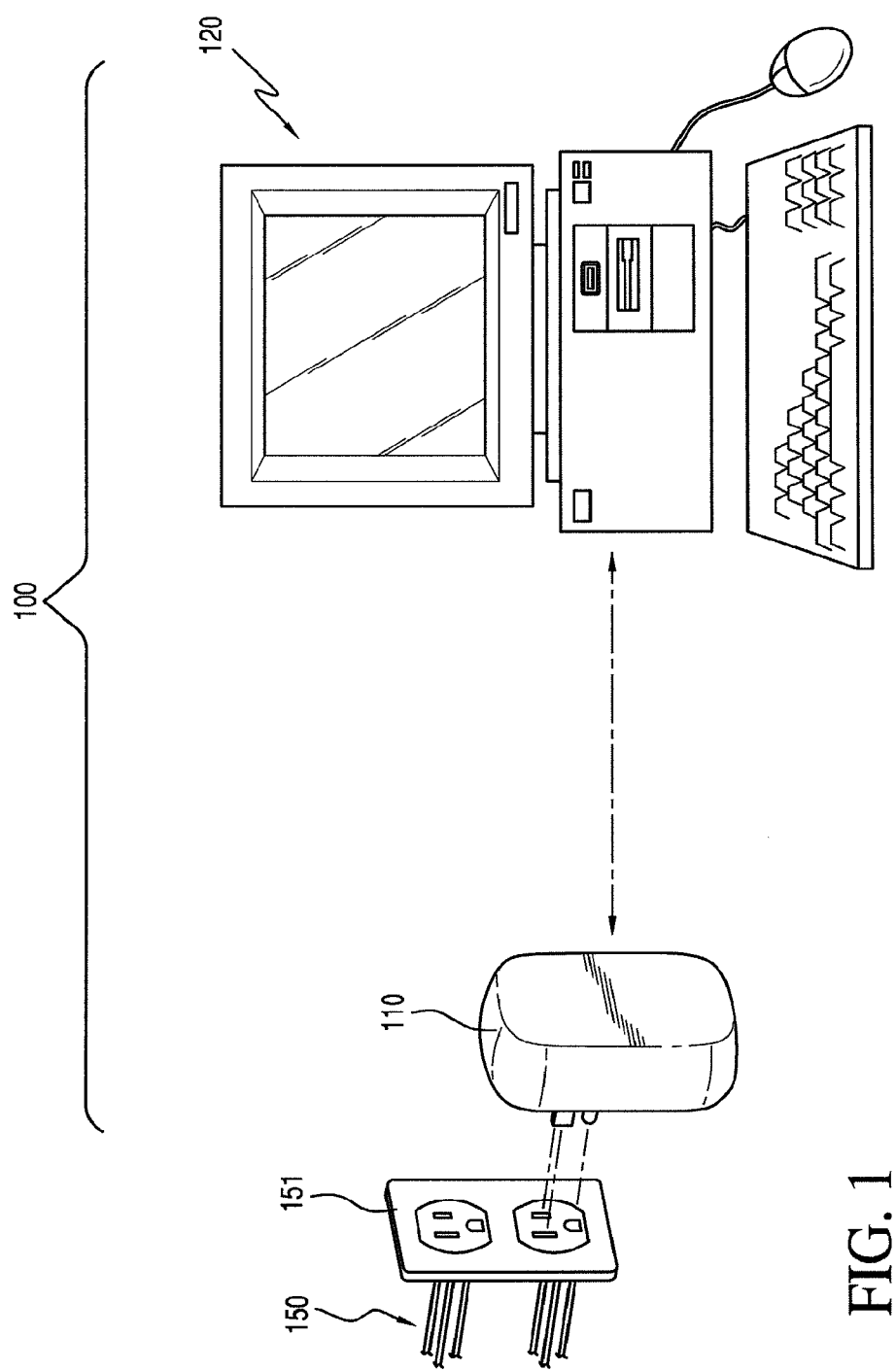
FIG. 1 illustrates a diagram of an exemplary electrical event detection device, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled" and the like does not mean that the coupling, etc. in question is or is not removable.

DETAILED DESCRIPTION OF EXAMPLES OF EMBODIMENTS

Some embodiments can concern an apparatus configured to detect an electrical state of one or more electrical devices. The one or more electrical devices are coupled to an electrical power infrastructure and generate high-frequency electrical noise on the electrical power infrastructure. The apparatus can include: (a) a processing module configured to run on a processor of a computational unit; and (b) a sensing device configured to be coupled to an electrical outlet. The sensing device can have: (a) a data acquisition receiver configured to receive the high-frequency electrical noise via the electrical outlet and convert the high-frequency electrical noise into one or more first data signals when the sensing device is coupled to the electrical outlet. The electrical outlet can be electrically coupled to the electrical power infrastructure. The processing module is further configured to identify the electrical state of the one or more electrical devices at least in part using the one or more first data signals. The sensing device is in communication with the computational unit. The high-frequency electrical noise comprise electrical noise in the ten kilohertz to three megahertz range.

Other embodiments concern a method of detecting and classifying electrical power usage by one or more electrical devices. The one or more electrical devices are coupled to an electrical power line The method can include: capturing two or more electrical signals on the electrical power line, the two or more electrical signals comprise substantially continuous electrical noise; detecting an occurrence of one or more electrical events on the electrical power line using at least in part the substantially continuous electrical noise in the two or more electrical signals; and associating the one or more electrical events with a change in an electrical state of at least one device of the one or more electrical devices. The substantially continuous electrical noise in the two or more electrical signals comprises electrical signals that are identifiable on the electrical power line for a length of time greater than approximately one second.

Still further embodiments concern an electrical event detection device configured to detect two or more electrical events in a power line infrastructure of a structure. The electrical event detection device can include: (a) a receiving module configured to receive and process one or more electrical signals, the one or more electrical signals comprise a high-frequency component, the receiving module having: (1) an electrical interface configured to couple to the power line infrastructure; (2) one or more filter circuits coupled to the electrical interface and configured to pass one or more portions of the one or more electrical signals; and (3) a converter module coupled to an output of the one or more filter circuits and configured to convert the one or more electrical signals into one or more data signals, the one or more data signals comprise information regarding the high-frequency component of the one or more electrical signals; and (b) a processing module configured to run on a processor, the processing module having: (1) an event detection module configured to use the information regarding the high-frequency component of the one or more electrical signals to determine whether the two or more electrical events have occurred; (2) a classification module configured to classify the two or more electrical events; and (3) a training module configured to correlate a first type of event with a first event of the two or more electrical events and to correlate a second type of event with a second event of the one or more electrical events. The two or more electrical events comprise turning on of one or more electrical devices coupled to the electrical power line infrastructure of the structure and turning on of one or more electrical devices coupled to the electrical power line infrastructure of the structure. The high-frequency component of the one or more electrical signals comprise electrical signals above ten kilohertz.

Electrical power on electrical power lines can include electrical noise. The electrical noise present on an electrical power line can be caused by the operation of an electrical device, which is electrically coupled to the electrical power line. This type of electrical noise is called conducted electromagnetic interference (EMI). EMI can be classified into two types: transient noise and continuous noise. In some embodiments, continuous or transient electrical noise that occurs when an electrical device is turned-on is not the same shape of the electrical noise after a few alternating current electrical cycles (e.g., one alternating current electrical cycle is 1/60th of a second in the United States). For example, the electrical noise of a compact fluorescent light bulb (CFL) has one shape for a few alternating current electrical cycles while the CFL is warming up and then the shape of the electrical noises changes to second shape after the CFL is warmed-up. In another example, DC (direct current) motors have a continuous noise but the continuous noise of the DC motor can only lasts microseconds but can repeat every alternating current electrical cycle while the DC motor is running. The electrical event detection device described below can detect all of these types of electrical noise.

Transient noise is characterized by the short duration for which it can be observed, generally tens of nanoseconds to a few milliseconds. Continuous noise (i.e., substantially continuous noise), on the other hand, can be observed for as long as the electrical device is operational. In many embodiment, "continuous noise," as used herein, can mean repetitive, continual, uninterrupted, or repeated noise. In the same or different embodiments, noise can be continuous if a pattern in the noise is repeated every alternating current cycle or if an electrical noise signal is observed without cessation while the electrical device is operation. Noise can be still considered continuous noise if a one alternating current cycle break occurs in the noise.

In many examples, continuous electrical noise can be identifiable on the electrical power line for a length of time greater than one alternating current electrical cycle. In another example, continuous electrical noise can be identifiable for a length of time that is less than one alternating current cycle but the electrical signals are repeated in three or more alternating current electrical cycles. In another example, continuous electrical noise can be electrical signals that are identifiable on the electrical power line for a length of time greater than approximately ten milliseconds. In another example, continuous electrical noise can be electrical signals that are identifiable on the electrical power line for a length of time greater than approximately fifty milliseconds. In still other examples, continuous electrical noise can be electrical signals that are identifiable on the electrical power line for a length of time greater than approximately one second. In yet further examples, continuous electrical noise can be electrical signals that are identifiable on the electrical power line for a length of time greater than approximately ten seconds.

Both transient and continuous noise can either be concentrated within a narrow frequency band or spread over a wider bandwidth (i.e., broadband noise). A CFL is an example of an electrical device that generates continuous noise, which is conducted over the electrical power line due to its electrical coupling with the electrical power line infrastructure. Because a structure's electrical distribution system is interconnected in parallel at the structure's circuit breaker panel, conducted EMI propagates widely from a given electrical device throughout the electrical line infrastructure of the structure.

Continuous noise is usually intrinsic to an electrical device's operation and internal electronics. Appliances like a grinder emit electrical noise synchronous to the frequency of AC (alternating current) power (60 Hz in the USA) and its harmonics (120 Hz, 180 Hz, etc.) due to the continuous making and breaking of electrical contact by motor bushes of this type of electrical device.

A switched-mode power supply (SMPS) is an electrical power supply unit that incorporates a switching regulator to provide the output voltage required by electrical devices using the SMPS. The function of the SMPS is to provide a regulated output voltage usually at a different level from the input voltage received from the electrical power infrastructure. Electrical devices using SMPS have become increasingly prevalent because of their higher efficiency, smaller size, and lower cost compared to traditional power supplies. Additionally, manufacturers increasingly employ SMPS in their products to meet minimum energy efficiency requirements (e.g., the United States Department of Energy's Energy Star program). For example, most personal computers as well as fluorescent lighting now use SMPS. More than ten years ago, most consumer electronic devices did not employ SMPS because of the immature state of SMPS technology and the absence of low cost, single chip SMPS implementations.

Modern SMPS-based electrical devices generate noise that is synchronous to their power supply's internal oscillator. Additionally, in contrast to traditional linear power regulators, an SMPS does not dissipate excess power as heat, but instead stores energy in an inductor and switches this stored energy in from the electrical power line and out to the load as required, and thus wasting much less energy than traditional electrical power supplies. The key to an SMPS smaller size and efficiency is its use of a power transistor to switch the stored electrical energy at a high-frequency, also known as the switching frequency. The switching frequency is usually much higher than the 60 Hz AC line frequency (in the U.S.) because, at higher frequencies, the inductors or transformers required are much smaller. A typical SMPS operates at tens to hundreds of kilohertz (kHz). The switching waveform can be adjusted to match the power requirements of the electrical device that the SMPS is powering. For example, a CFL's power supply employs an SMPS to generate the high voltages necessary to power the CFL. The switching action, which is the cornerstone of an SMPS's operating principle, generates a large amount of EMI centered around the switching frequency.

Moreover, most modern consumer electronic appliances are moving towards using a "soft switch" instead of a mechanical switch. Unlike a mechanical switch, a soft switch uses a software driven push button that electronically cycles the electrical power to the electrical device. In this type of switch, the indirect activation of the electrical device by a software driven electronic switch minimizes the transient noise generated at the moment of activation. It was observed that several devices, such as LCD (liquid crystal display) monitors and DVD players, which use soft switches, did not generate any detectable transient noise. Software driven devices, such as LCD monitors and DVD plays, are nearly always SMPS-based, and thus, electrical event detection device 100 (FIG. 1) can detect their change in power state by monitoring the EMI produced by the electrical devices.

Like modern SMPS-based electrical devices, dimmers also produce continuous noise due to the triggering of at least one internal triac switch. This continuous noise can be used to detect and identify incandescent loads the dimmer controls. In contrast to the narrowband noise produced by SMPS, a dimmer produces broadband noise spanning hundreds of kilohertz, which can be modeled as a Gaussian distribution having a large variance.

Moreover, in the United States, the Federal Communications Commission (FCC) has set rules (e.g., 47 C.F.R. part 15/18: Consumer Emission Limits) for any electrical device that couples to the electrical power line infrastructure that dictate the maximum amount of EMI an electrical device can conduct back onto the electrical power line infrastructure. The FCC limit is currently 66 dBuV (decibel ratio of volts to one microvolt) for a frequency range between 150 kHz to 500 kHz, which is nearly −40 dBm (decibel ratio of watts to one milliwatt) across a 50 ohm load.

Figure 2:
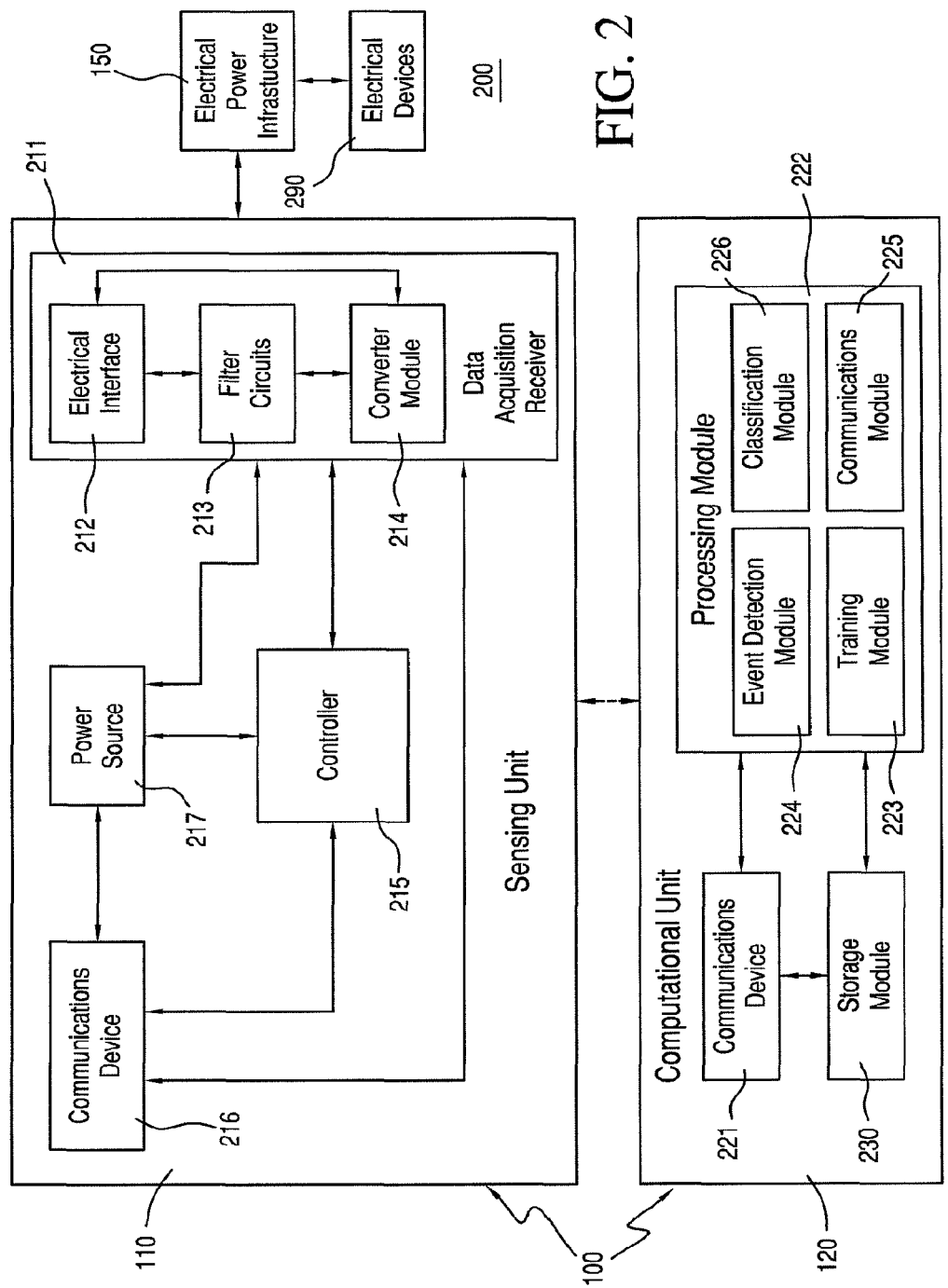
FIG. 2 illustrates a block view of the electrical event detection device of FIG. 1, according to the first embodiment.

Now turning to the drawings, FIG. 1 illustrates a diagram of an exemplary electrical event detection device 100, according to a first embodiment. FIG. 2 illustrates a block view of an exemplary system 200 including electrical event detection device 100, according to the first embodiment. In some embodiments, electrical event detection device 100 can be configured to detect an electrical state of one or more electrical devices 290 (FIG. 2) in system 200. Electrical event detection device 100 can also be configured to detect one or more electrical events in an electrical power line infrastructure 150 of a structure in system 200. In many examples, electrical event detection device 100 can use continuous noise placed on electrical power line infrastructure 150 by electrical devices 290 to detect the electrical state of electrical devices 290 or to detect electrical events on electrical power line infrastructure 150. System 200 and electrical event detection device 100 are merely exemplary and are not limited to the embodiments presented herein. Electrical event detection device 100 can be employed in many different embodiments or examples not specifically depicted or described herein.

In some examples, electrical devices 290 generate one or more high-frequency electrical signals. In various embodiments, the high-frequency electrical signals (e.g., electrical signals in the tens of kilohertz to a few megahertz range) can be generated by one or more SMPS or other electrical components (e.g., internal triac switches or internal oscillators (other than the SMPS)) of electrical devices 290. In the same or different examples, high-frequency electrical signals can be cyclostationary with respect to an alternating current electrical cycle of electrical power infrastructure 150. The high-frequency electrical signals can be wide-sense cyclostationary signals. In some examples, the high-frequency electrical signals can exhibit cyclostationarity in second, third, or fourth order statistics.

In many embodiments, high-frequency electrical signals are electrical signals in the ten kilohertz to three megahertz range. In yet other embodiments, high-frequency electrical signals are high-frequency electromagnetic interference in a range of approximately ten kilohertz to approximately one megahertz. In still another embodiment, high-frequency electrical signals are high-frequency electromagnetic interference in a range of approximately thirty kilohertz to approximately three hundred kilohertz.

In the same or different embodiments, the high-frequency electrical signals are electrical signals above approximately ten kilohertz. In some embodiments, electrical event detection device 100 can be sensitive enough to capture continuous noise from −100 dBm to −10 dBm across a frequency range of approximately ten kilohertz to approximately three megahertz or, more specifically, approximately ten kilohertz to approximately one megahertz.

In some examples, the one or more electrical events detected by electrical event detection device 100 can include actuation and deactuation (i.e., turning on and turning off) of electrical devices 290 coupled to electrical power line infrastructure 150. The one or more electrical events can also be events where the amount of electrical power provided by an electrical device's electrical power supply to the rest of the electrical device (e.g., turning a dimmer switch) is varied or limited. As used herein, each of electrical devices 290 can have one of three power states: (a) an on-power state; (b) a standby power state; or (c) a complete off-power state. The on-power state includes all electrical power states when an electrical device is powered on and when the electrical power usage of the electrical device is more than nominal (i.e., it is not in a standby or off-power state).

The standby power state is an electrical state where the electrical device is nominally off, but is still drawing electrical power for one or more functions of the electrical devices. That is, electrical devices in the standby power state are nominally turned off, but still draw electrical power for one or more default, continuing, or constant functions. For example, after a user turns off a video cassette recorder (VCR) or an digital video recorder (DVR), the VCR and DVR can continue to draw electrical power from electrical power line infrastructure 150 to light one or more displays on the device (e.g., a clock or one or more LEDs (light emitting diodes)) and/or perform one or more internal functions. In this case, although the user believes the VCR or DVR is off, the VCR or DVR is actually in a standby power state. In another example, after a user turns off an electrical device, the electrical device can continue to draw electrical power to charge an internal battery and, thus, is in a standby power state.

A complete off-power state is a power state where an electrical device is not drawing any electrical power (i.e., truly zero electrical power) from electrical power line infrastructure 150. In the case of the VCR or DVR that draws electrical power even after a user turns off the electrical device, the VCR or DVR can be placed in a complete off state by unplugging the electrical device from electrical power line infrastructure 150 or plugging the VCR or DVR into an electrical switch that completely stops the VCR or DVD from drawing electrical power.

As used herein, "turning on" and similar phrases refer to moving an electrical device to an on-power state from either a completely off-power state or a standby power state. Similarly, as used herein, "turning off" and similar phrases refer to moving an electrical device from an on-power state to either a complete off-power state or a standby power state. Furthermore, a "power-off state" and similar phrases refer to either a complete power off state or a standby power state. A "power-on state" and similar phrases refer to an on-power state.

In some examples, as will be discussed below in regards to dimmers and televisions, electrical event detection device 100 can also detect intermediate states of electrical devices 290. That is, electrical event detection device 100 can detect different on-power state of electrical devices 290.

Figure 3:
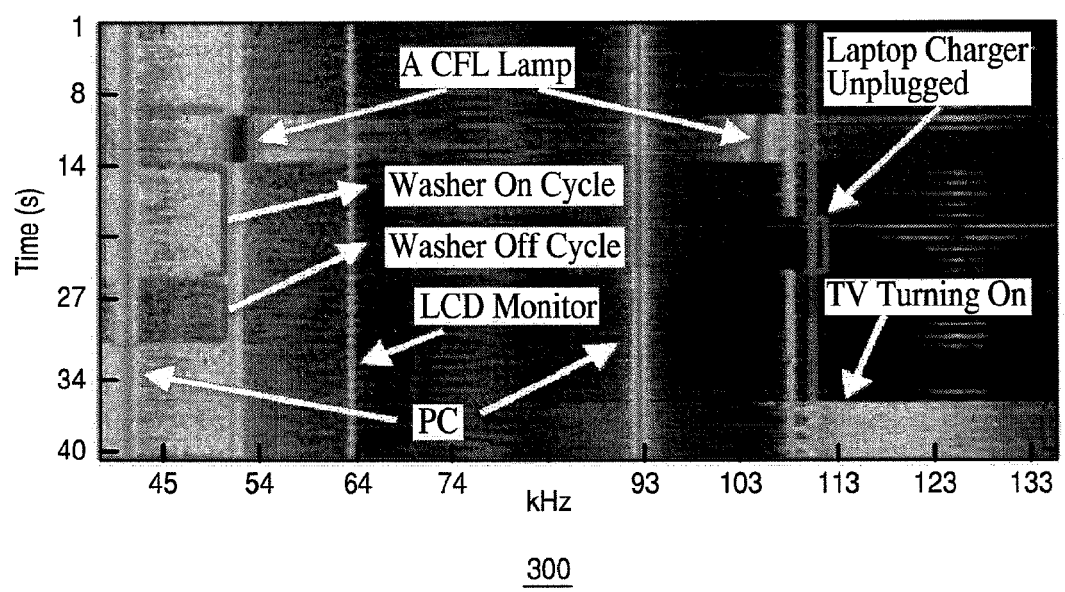
FIG. 3 illustrates an exemplary frequency domain waterfall plot showing electrical devices being turned on and off, according to an embodiment.

FIG. 3 illustrates an exemplary frequency domain waterfall plot 300 showing electrical devices being turned on and off, according to an embodiment. As shown in FIG. 3, when an exemplary electrical device is turned on, a narrowband continuous noise signature that lasts for the duration of the device's operation is seen. In addition, it can be seen in FIG. 3 that the noise is strongest in intensity at the noise center (e.g., the switching frequency of an SMPS of the electrical devices) and then extends to lower and higher frequencies with decaying intensity. The decaying intensity can loosely be modeled with a Gaussian function having its mean at the switching frequency. This distribution can be attributed to the error tolerance of the components that make up the switching circuit core, as well as the characteristics of the power supply's load. If all the electrical devices and their components were ideal, a single narrow signal peak at the switching frequency would be seen in FIG. 3. The error tolerance of SMPS components also can allow for distinction between otherwise identical devices, such as a variety of units of the same model of CFLs. Finally, the electrical power line itself can be thought of as a transfer function (i.e., a difference in the inductance between the sensing source and the electrical device) and can provide additional discrimination among multiple similar electrical devices.

Referring back to FIGS. 1-2, electrical event detection device 100 can include: (a) at least one sensing unit 110 configured to be coupled to at least one electrical outlet 151 of electrical power line infrastructure 150 (i.e., the electrical power lines in the structure); and (b) at least one computational unit 120. In some embodiment, electrical event detection device 100 does not include electrical power line infrastructure 150, electrical outlet 151, or electrical devices 290. In a different embodiment, electrical event detection device 100 also does not include computational unit 120. In some examples, electrical detection device 100 includes processing module 222 (FIG. 2) but not computational unit 120.

Sensing unit 110 can include: (a) at least one receiver module or data acquisition receiver 211; (b) a controller 215; (c) a communications device 216 with a transmitter; and (d) a power source 217 configured to provide electrical power to data acquisition receiver 211, controller 215, and communications device 216. Computational unit 120 can include: (a) a communications device 221 with a receiver; (b) a processing module 222; and (c) a storage module 230.

Not to be taken in a limiting sense, a simple example of using electrical event detection device 100 involves electrical devices 290 (FIG. 2) generating one or more high-frequency electrical signals (e.g., EMI) on electrical power line infrastructure 150. Sensing unit 110 can detect the high-frequency electrical signals (e.g., continuous noise) on electrical power line infrastructure 150 and create one or more data signals that include information regarding the high-frequency electrical signals. Sensing unit 110 can communicate the data signals to computational unit 120 using a wired and/or wireless communication method. Computational unit 120 can identify the electrical state of electrical devices 290 at least in part using the data signals.

Data acquisition receiver 211 can be configured to receive and process one or more electrical signals from electrical power line infrastructure 150. The electrical signals can include high-frequency components (e.g., EMI). That is, data acquisition receiver 211 can be configured to receive electrical signals with a high-frequency component and convert the electrical signals and, in particular, the high-frequency component into one or more data signals.

Figure 4:
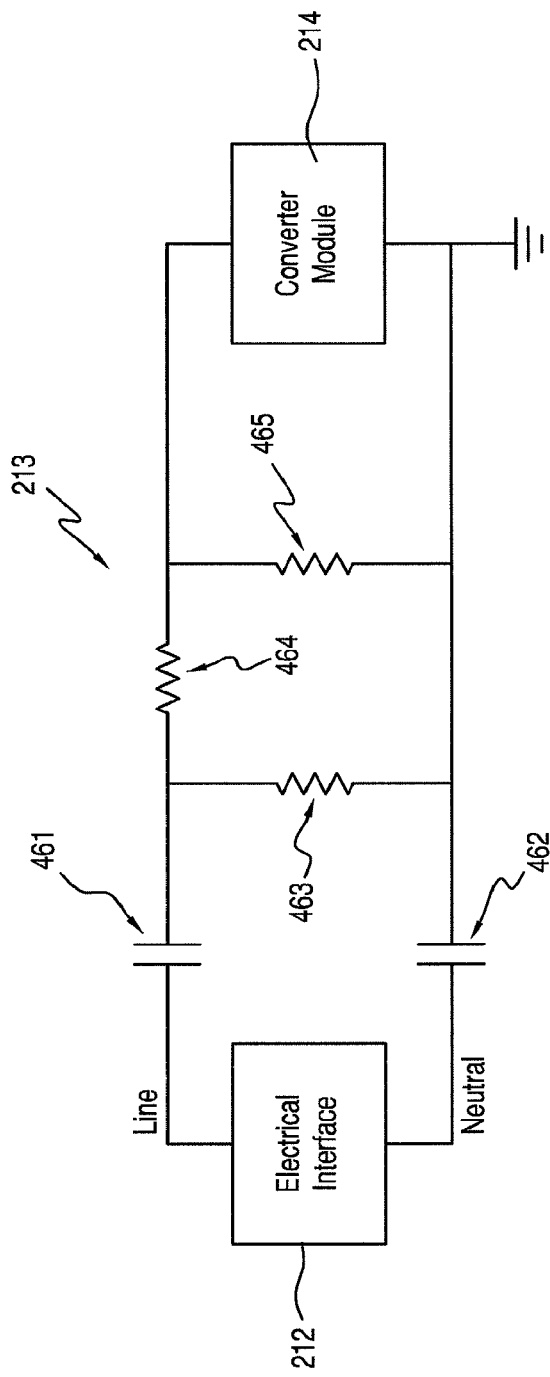
FIG. 4 illustrates a partial circuit diagram of an exemplary data acquisition receiver of the electrical event detection device of FIG. 1, according to the first embodiment.

FIG. 4 illustrates a partial circuit diagram of an exemplary data acquisition receiver 211, according to the first embodiment. Referring to FIGS. 2 and 4, in various embodiments, data acquisition receiver 211 can include: (a) at least one electrical interface 212 configured to be coupled to electrical outlet 151 (FIG. 1) of electrical power line infrastructure 150; (b) one or more filter circuits 213; and (c) at least one converter module 214. In various embodiments, electrical interface 212 can include a two prong or three prong electrical power connector.

In some examples, filter circuits 213 can be electrically coupled to the electrical interface 212 and configured to filter out portions of the incoming electrical signals from the electrical power infrastructure. Filter circuits can be configured to pass the high-frequency electrical noise. For example, data acquisition receiver 211 can filter out the AC line frequency (60 Hz in the U.S.) so that converter module 214 is not overloaded by the strong 60 Hz frequency component. In the same or different examples, filter circuits 213 can include a high pass filter. In some embodiments, the high pass filter can have an essentially flat frequency response from 50 kHz to 30 MHz (megahertz). The 3 dB (decibel) corner of the high pass filter can be at 36.7 kHz. This 3 dB corner allows a wide enough band to view the complete range of EMI and other high-frequency continuous noise in the electrical signals. In some examples, filter circuits 213 can also include a 10 dB attenuator so that a constant 50-ohm load is presented at the input of data acquisition receiver 211, irrespective of the signal frequency or the AC line conditions. Additionally, in some examples, for safety and isolation from the line voltage, high voltage capacitors can be used. In the same or different examples, the polarity shown in FIG. 4 can be used. That is, in one embodiment, the line and neutral lines should not be connected in reverse, and the isolation capacitors should be of AC-line rated polyester film type for safety.

In some examples, filter circuit can include capacitors 461, 462 and resistors 463, 464, 465. Capacitors 461 and 462 can be 0.1 uF capacitors (450 V polyester capacitors). Resistors 463 and 465 can be 100 ohm, 1 watt rated resistors. Resistor 464 can be a 75 ohm, 1 watt rated resistors.

Converter module 214 can be electrically coupled to filter circuits 213 and can be configured to receive the filtered signal from filter circuits 213. Converter module 214 can be configured to convert the one or more filtered signals into one or more data signals. The one or more data signals can include information regarding the high-frequency component of the one or more electrical signals. In some examples, converter module 214 can include an analog-to-digital converter. In some examples, the analog-to-digital converter can sample the filtered electrical signal at a predetermined rate (e.g., 1 MHz). In one example, converter module 214 can include a USRP (universal software radio peripheral).

In some examples, communications device 216 can include a wireless transmitter, and communications device 221 can be a wireless receiver. In some examples, electrical signals can be transmitted using WI-FI (wireless fidelity), the IEEE (Institute of Electrical and Electronics Engineers) 802.11 wireless protocol, or the Bluetooth 3.0+HS (High Speed) wireless protocol. In further examples, these signals can be transmitted via a Zigbee (802.15.4), Z-Wave, or a proprietary wireless standard. In other examples, communications device 216 can transmit electrical signals using a cellular connection or a wired connection (e.g., using a wire).

In North America and many other parts of the world, three-phase electrical power is commonly used by the electrical power infrastructure in most structures. In some structures, a strong noise signal across the phases in electrical power line infrastructure 150 is detectable. However, for some parts of some structures, which are on the opposite phase from the electrical outlet 151 to which electrical interface 212 is coupled, it can be difficult to detect electrical events. In some examples, either installing a sensing unit 110 on each phase (i.e., installing two sensing units for a structure using three-phase electrical power) or installing sensing unit 110 in an available 240 V outlet where both phases are present (e.g., the electrical connector for a dryer) can address this problem. Installing two sensing units 110 would allow electrical event detection device 100 to capture events from both phases, but also increases the chances of similar-looking signatures for two similar devices. The problem of similar-looking signatures, however, can be addressed by knowing which of the two sensing units 110 detected the event.

In some examples, processing module 222 can comprise software and can include: (a) a training module 223 configured to correlate one or more electrical events with one or more different types of electrical events; (b) an event detection module 224 configured to determine whether the one or more electrical events have occurred at least in part using the data signals; (c) a classification module 226 configured to classify the type of the one or more electrical events; and (d) a communications module 225 configured to communicate with a user.

Computational unit 120 or processing module 222 can be configured to identify the electrical state of electrical devices 290 at least in part using the one or more first data signals (e.g., information regarding the high-frequency component of the one or more electrical signals). In various embodiments, computational unit 120 and/or processing module 222 can be configured to determine the electrical power consumed by the one or more electrical devices at least in part using the one or more data signals from communications device 216. For example, processing module 222 can be configured to identify when a first one of one or more electrical devices 290 is powered-on or powered-off at least in part using the data signals from communications device 216.

As will be discussed in detail below, in some examples, in addition to the data signals received from sensing unit 110, processing module 222 can use the following types of data to identify the electrical state of electrical devices 290: (a) data from database from a regulatory agency; (b) data from one or more databases that contain data regarding previously observed data signals; (c) data from one or more labels of the electrical devices; and/or (d) data from the user regarding identification of the one or more electrical devices.

As will be described in more detail below, event detection module 224 is configured to determine whether the one or more electrical events have occurred at least in part using the data signals from communications device 216. Classification module 226 can be configured to determine the specific electrical event of the electrical devices that caused the electrical events on electrical power line infrastructure 150. Classification module 226 can be configured to correlate electrical events on electrical power line infrastructure 150 with changes in the electrical power state of specific electrical devices.

Training module 223 can be configured to correlate specific electrical signals on electrical power line infrastructure 150 with specific electrical events. For example, training module 223 can be configured to determine that a specific electrical event on electrical power line infrastructure 150 corresponds to turning-on or turning off a specific electrical application (e.g., a fluorescent light, a computer, or a washing machine).

In some examples, training module 223 can be configured to perform a training or calibration sequence to correlate electrical events detected by data acquisition receiver 211 with specific electrical events. After performance of the calibration sequence, training module 223 can provide the training correlation data to classification module 226 so that classification module 226 can correlate the electrical events detected by data acquisition receiver 211 with a specific change in state of a specific electrical device. Exemplary training or calibration sequences are described in relation to activity 835 of method 800 in FIG. 8.

Communications module 225 can be used to communicate information to and receive information from one or more users of electrical event detection device 100. For example, a user can use communications module 225 to enter information during a training or calibration sequence. Additionally, communications module 225 can inform a user when an electrical event occurs. In some embodiments, communications module 225 can use monitor 2306, keyboard 2304, and/or mouse 2310 of FIG. 23.

Storage module 230 can store information and data used by training module 223, event detection module 224, communications module 225, and classification module 226. In some examples, storage module 230 can include a USB device in USB port 2312 (FIG. 23), a CD-ROM or DVD in CD-ROM and/or DVD drive 2316 (FIG. 23), hard drive 2314 (FIG. 23), or memory 2408 (FIG. 24).

Figure 23:
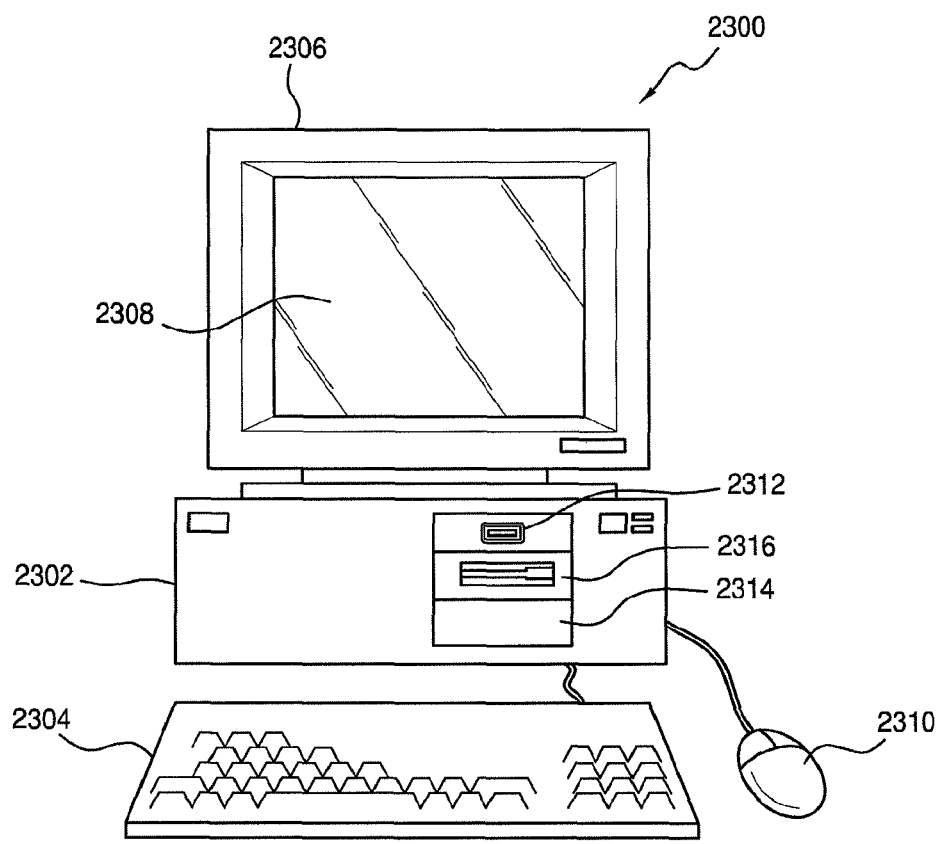
FIG. 23 illustrates a computer that is suitable for implementing an embodiment of the computing unit of FIG. 1.
Figure 24:
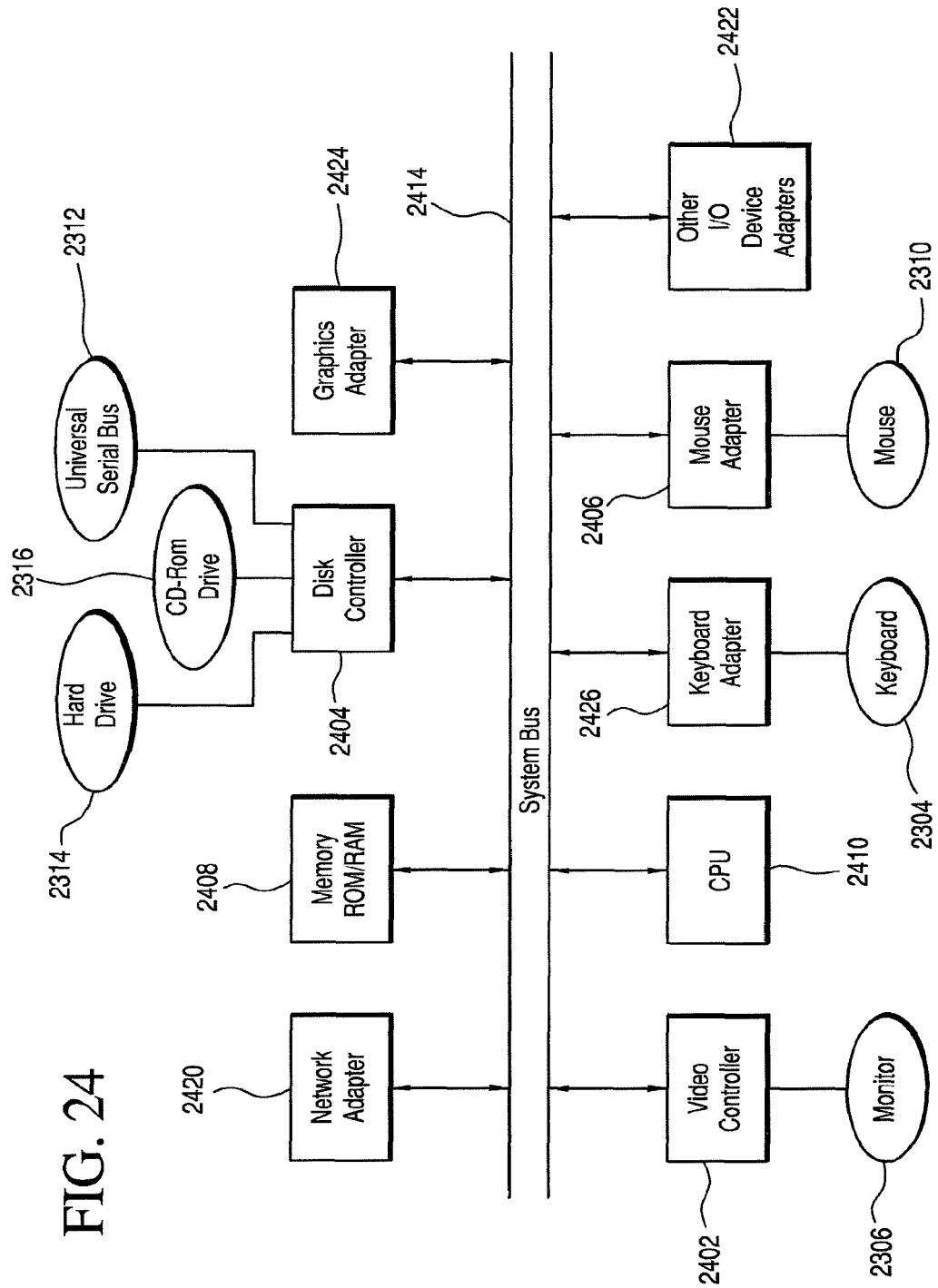
FIG. 24 illustrates a representative block diagram of an example of the elements included in the circuit boards inside the chassis of the computing unit of FIG. 23.

Processing module 222 can be configured to run on a processor (e.g., Central Processing Unit (CPU) 2410 of FIG. 24) of computational unit 120. "Computational Unit," as used herein, can refer to a single computer, single server, or a cluster or collection of computers and/or servers at one or more locations. In one example, computational unit 120 can include the computer illustrated in FIGS. 23 and 24. In some examples, computational unit 120 can be at least partially local to the user. In other examples, the user can access computational unit 120 through the Internet or other networks.

In some examples, computational unit 120 can be a first server. The first server can be home computer of the user of electrical event detection device 100 or a computer owned or controlled by the owner of the building in which electrical event detection device 100 is installed. In other examples, first server can be another electrical device (with a processor) located in the structure (e.g., a home control or automation system, a security system, an environmental control system). The first server can include a first portion of communications device 221, storage module 230, training module 223, event detection module 224, communications module 225, and classification module 226. One or more second servers (e.g., a computer or server owned or controlled by the manufacturer or distributor of electrical event detection device 100, a utility company, or a security monitoring company) can include a second, possibly overlapping, portion of these modules. In these examples, computational unit 120 can comprise the combination of the first server and the one or more second servers.

Figure 5:
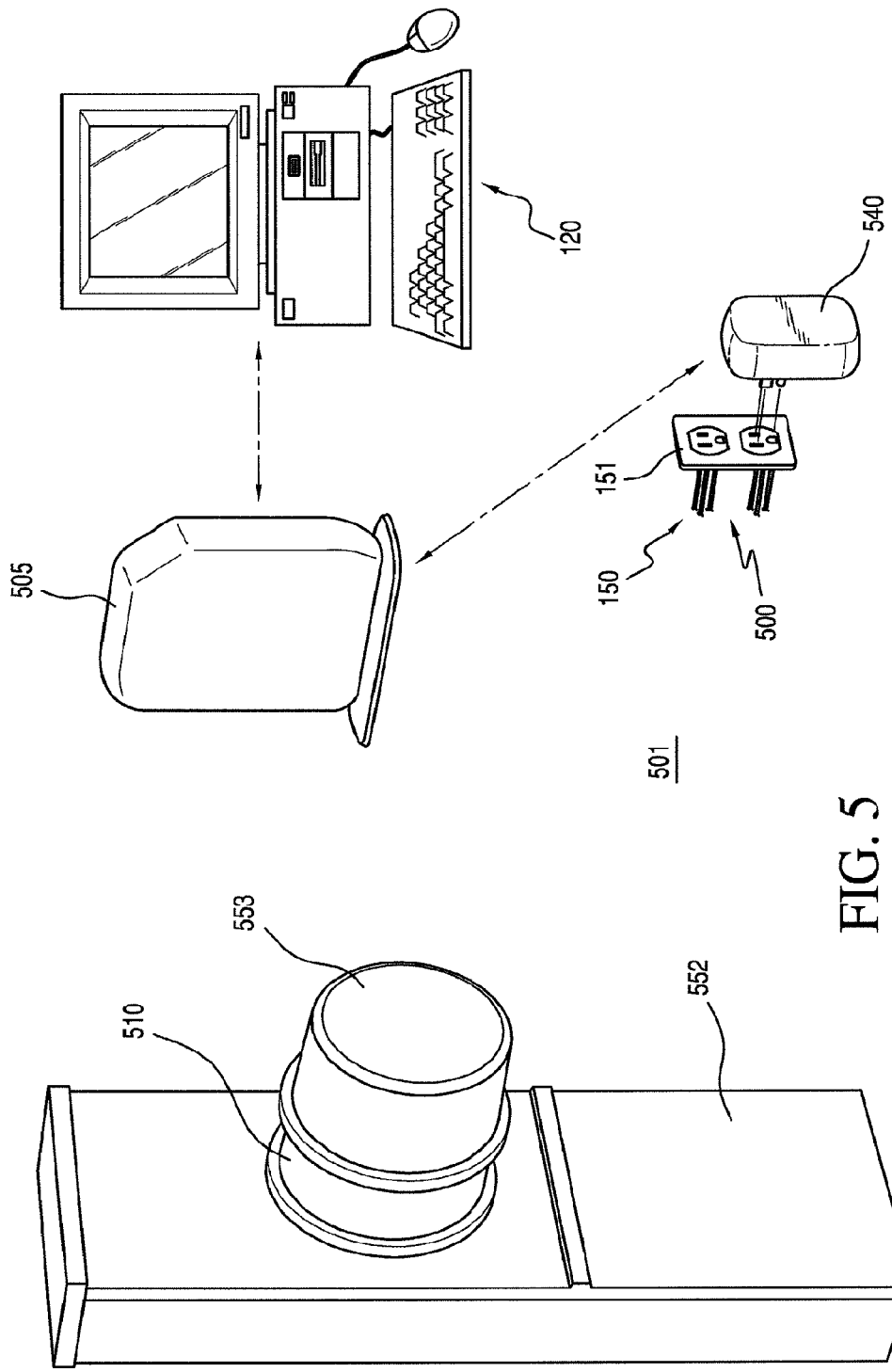
FIG. 5 illustrates a diagram of an exemplary electrical event detection device, according to a second embodiment.
Figure 6:
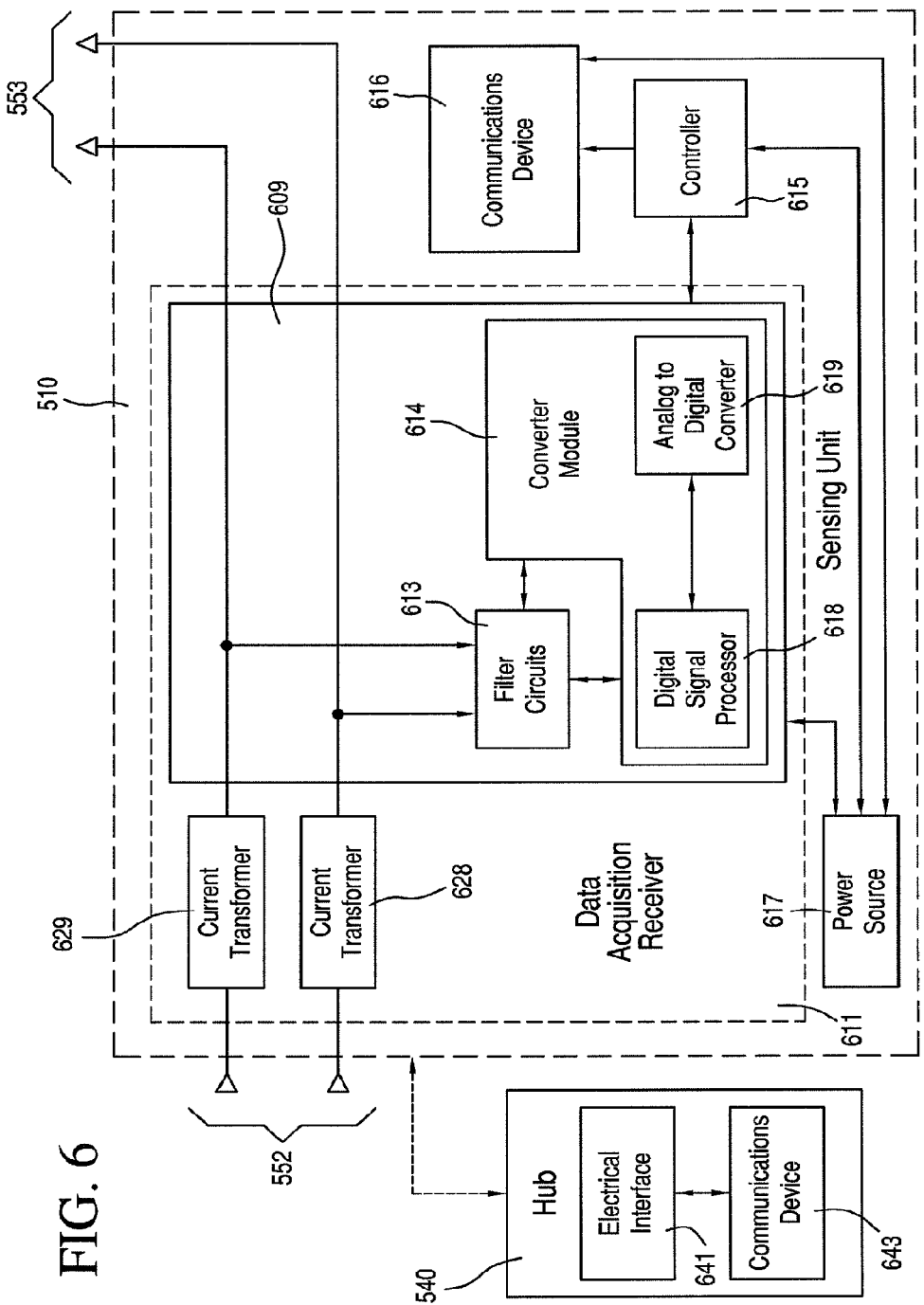
FIG. 6 illustrates a block view of a sensing unit of the electrical event detection device of FIG. 5, according to the second embodiment.

FIG. 5 illustrates a diagram of an exemplary system including an electrical event detection device 500, according to a second embodiment. FIG. 6 illustrates a block view of a sensing unit 510 of electrical event detection device 500, according to the second embodiment. In some embodiments, electrical event detection device 500 can be configured to detect an electrical state of one or more electrical devices 290 (FIG. 2) of system 501. Electrical event detection device 500 can also be configured to detect one or more electrical events in an electrical power line infrastructure 150 (FIGS. 1 and 5) of system 501. In many examples, electrical event detection device 500 can use continuous noise placed on electrical power line infrastructure 150 by electrical devices 290 (FIG. 2) to detect the electrical state of electrical devices 290 or to detect electrical events on electrical power line infrastructure 150. The electrical events detected by electrical event detection device 500 can include actuation and deactuation (i.e., turning on and turning off) of electrical devices 290 (FIG. 2) coupled to electrical power line infrastructure 150. The one or more electrical events can also be events where the amount of electrical power provided by an electrical device's electrical power supply to the rest of the electrical device (e.g., turning a dimmer switch) is varied or limited. System 501 and electrical event detection device 500 are merely exemplary and are not limited to the embodiments presented herein. System 501 and electrical event detection device 500 can be employed in many different embodiments or examples not specifically depicted or described herein.

Referring to FIGS. 5 and 6, electrical event detection device 500 can include: (a) sensing unit 510; (b) a hub 540 configured to couple to electrical outlet 151 of electrical power line infrastructure 150; (c) a router 505 configured to couple hub 540 to computational unit 120; and (d) computational unit 120. In other examples, hub 540 can coupled to computational unit 120 without use of router 505, in which case electrical event detection device 500 and system 501 do not include router 505.

In some examples, sensing unit 510 is coupled to at least one of an electrical breaker panel 552 and a utility wattmeter

553. In other examples, sensing unit 510 can be integrated with or be part of at least one of electrical breaker panel 552 or utility wattmeter 553. In one embodiment, electrical event detection device 500 does not include electrical breaker panel 552, utility wattmeter 553, electrical power line infrastructure 150, electrical outlet 151, or electrical devices 290. In a different embodiment, electrical event detection device 500 also does not include computational unit 120 or router 505. In some examples, electrical event detection device 500 can include processing module 222 but not computational unit 120.

Not to be taken in a limiting sense, a simple example of using electrical event detection device 500 involves electrical devices 290 (FIG. 2) generating one or more high-frequency electrical signals. Sensing unit 510 can detect the high-frequency electrical signals on electrical power line infrastructure 150 and create one or more data signals that include information regarding the high-frequency electrical signals. Sensing unit 510 can communicate the data signals to hub 540 using a power line communication (PLC) method over electrical power line infrastructure 150. Hub 540 can communicate the data signals to computational unit 120 using a wired or wireless communication method. Computational unit 120 can identify the electrical state of the one or more electrical devices at least in part using the data signals.

Referring to FIGS. 5 and 6, sensing unit 510 can include: (a) a data acquisition receiver 611; (b) a controller 615; (c) a communications device 616; and (d) a power source 617. In some examples, controller 615 and power source 617 can be similar to or the same as controller 215 and power source 217, respectively, of FIG. 2. Similar to sensing units 110 (FIGS. 1 and 2), sensing unit 510 can be configured to detect continuous noise on electrical power line infrastructure 150 by processing one or more electrical signals from electrical power line infrastructure 150. In some embodiments, sensing unit 510 can be configured to receive the electrical signals with a high-frequency component and convert the electrical signals and, in particular, the high-frequency component of the electrical signals into one or more data signals.

Data acquisition receiver 611 can include: (a) one or more current transformers 628 and 629; (b) one or more filter circuits 613; and (c) at least one converter module 614.

Currents transformers 628 and 629 can be used to measure the amount of AC current flowing through a conductor. Currents transformers 628 and 629 can produce a small, easy to measure signal that is proportional to the larger current in the conductor. Specifically, current transformers 628 and 629 measure the amount of current flowing through the two conductors coupling electrical breaker panel 552 to utility wattmeter 553 with one current transformer for each AC phase. The total power consumed by a structure is a sum of the electrical power supplied by each AC phase.

In other examples, current transformers 628 and 629 are not current transformers. Current transformers 628 and 629 can be any devices that measure current such as Hall effect sensors, Rogowski coils, current transformers, or shunt resistors. For example, current transformers 628 and 629 can be shunt resistors That is, the AC current can flow through a small resistance and data acquisition receiver 611 can measure the small voltage developed across the small resistor This measured small voltage is proportional to the amount of current flowing through the two conductors coupling electrical breaker panel 552 to utility wattmeter 553.

In some examples, filter circuits 613 are configured to filter out portions of the incoming electrical signals from the electrical power infrastructure 150. For example, filter circuits 613 can filter out the AC line fundamental frequency (60 Hz in the U.S.) so that converter module 614 is not overloaded by the strong 60 Hz frequency component. In the same or different examples, filter circuits 613 can include a high pass filter. In some examples, filter circuits 613 can be similar or the same as filter circuits 213 of FIG. 2.

Converter module 614 can be electrically coupled to filter circuits 613 and can be configured to receive the filtered signal from filter circuits 613. Converter module 614 can be configured to convert the one or more filtered signals into one or more data signals. The data signals can include information regarding the high-frequency component of the electrical signals. In some examples, converter module 614 can include: (a) an analog-to-digital converter 619; and (b) a digital signal processor 618.

In various embodiments, communications device 616 can include a PLC transmitter. A PLC transmitter can be a transmitter for transmitting data on a conductor used for electrical power transmission (e.g., electrical power line infrastructure 150). Communications device 616 can be electrically coupled to electrical power line infrastructure 150 and can be configured to communicate the data signals to hub 540 over electrical power line infrastructure 150. In the same or different examples, the PLC communications between communications device 616 and hub 540 can be bi-directional. In other examples, communications device 616 can be similar or identical to communications device 216 and can transmit the data signal directly to router 505 and/or computational unit 120.

Hub 540 can include: (a) an electrical interface 641 configured to be coupled to an electrical outlet 151 (FIG. 5) of electrical power line infrastructure 150 (FIG. 5); and (b) a communications device 643.

In various embodiments, electrical interface 641 can include a two prong or three prong electrical power connector. In some examples, electrical interface 641 can also include a PLC receiver. The PLC receiver of electrical interface 212 can be configured to receive data signals from communications device 616 of sensing unit 510 via electrical power line infrastructure 150. In some examples, electrical interface 641 can also include a PLC transmitter.

Communications device 643 can be electrically coupled to electrical interface 641 and receive the data signal from electrical interface 641. In some examples, communications device 643 can include a wireless transmitter. The wireless transmitter can transmit the data signals to computational unit 120 via router 505 (or directly to computational unit 120). In other examples, communications device 643 can be coupled to router 505 and/or computational unit 120 using a wire and communicate the data signals over the wire. In still other examples, hub 540 can be integrated with or be part of computational unit 120 or router 505.

Figure 7:
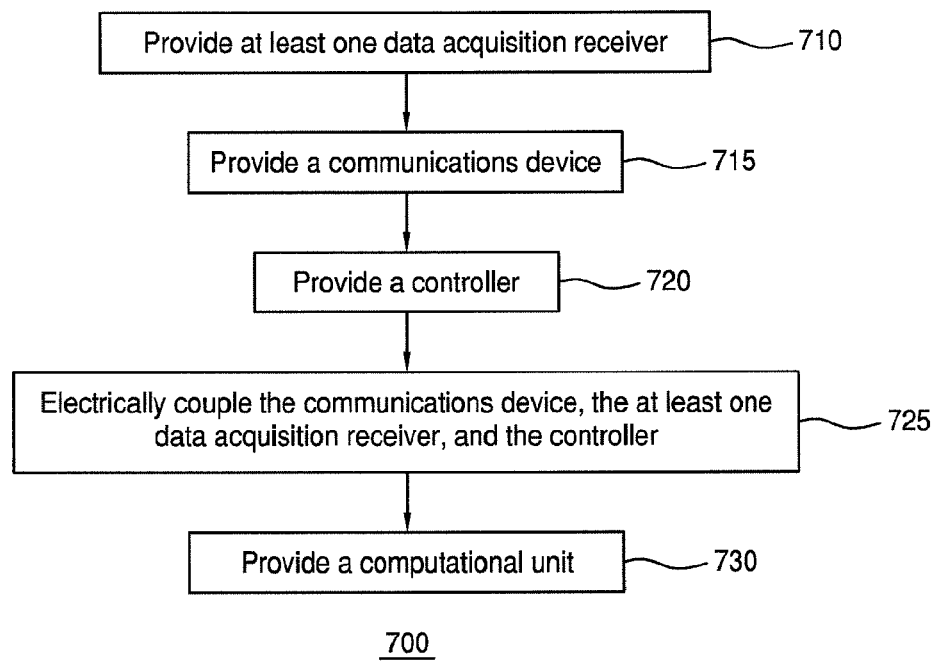
FIG. 7 illustrates a flow chart for an exemplary embodiment of a method of providing an electrical event detection device, according to an embodiment.

FIG. 7 illustrates a flow chart for an exemplary embodiment of a method 700 of providing an electrical event detection device, according to an embodiment. Method 700 is merely exemplary and is not limited to the embodiments presented herein. Method 700 can be employed in many different embodiments or examples not specifically depicted or described herein. In some embodiments, the activities, the procedures, and/or the processes of method 700 can be performed in the order presented. In other embodiments, the activities, the procedures, and/or the processes of the method 700 can be performed in any other suitable order. In still other embodiments, one or more of the activities, the procedures, and/or the processes in method 700 can be combined or skipped.

Referring to FIG. 7, method 700 includes an activity 710 of providing at least one data acquisition receiver. In some embodiments, the data acquisition receiver can be configured to receive and process one or more electrical signals from the electrical power infrastructure and convert the electrical signals into the first data signals. For example, the data acquisition receiver can be similar or identical to data acquisition receiver 211 of FIG. 2 or data acquisition receiver 611 of FIG. 6. In the same or different examples, activity 710 can include providing a second data acquisition receiver. In some examples, the first data acquisition receiver can be coupled to a first phase of the electrical power infrastructure of a structure and the second data acquisition receiver can be coupled to a second phase of the electrical power infrastructure of the structure.

Method 700 in FIG. 7 continues with an activity 715 of providing a communications device. In some embodiments, the communications device can include a transmitter and can be configured to transmit the first data signals. As an example, the communications device can be similar or identical to communications device 216 of FIG. 2 or communications device 616 of FIG. 6.

Subsequently, method 700 of FIG. 7 includes an activity 720 of providing a controller. As an example, the controller can be similar or identical to controller 215 of FIG. 2 or controller 615 of FIG. 6.

Next, method 700 of FIG. 7 includes an activity 725 of electrically coupling the communications device, the data acquisition receiver, and the controller. For example, the electrical coupling of the communications device, the data acquisition receiver, and the controller can be similar or identical to the electrical coupling of communications device 216, data acquisition receiver 211, and controller 215 of FIG. 2 or the electrical coupling of communications device 616, data acquisition receiver 611, and controller 615 of FIG. 6.

Method 700 in FIG. 7 continues with an activity 730 of providing a computational unit. In some embodiments, the computation unit can be configured to determine a change in electrical states of the one or more electrical devices using the first data signals. As an example, the computation unit can be similar or identical to computational unit 120 of FIGS. 1 and/or 5.

In some examples, activity 730 can include providing the computation unit to include: (a) a communications device configured to receive the data signals from the communications device; (b) a training module configured to correlate one or more electrical events with one or more different types of electrical events; (c) an event detection module configured to determine whether the electrical event(s) have occurred; (d) a classification module configured to classify the type of the electrical event(s); and (e) a communications module configured to communicate with a user. As an example, the communications device, the training module, the event detection module, the classification module, and/or the communications module can be similar or identical to communications device 221, training module 223, event detection module 224, classification module 226, and communications module 225, respectively, of FIG. 2.

Figure 8:
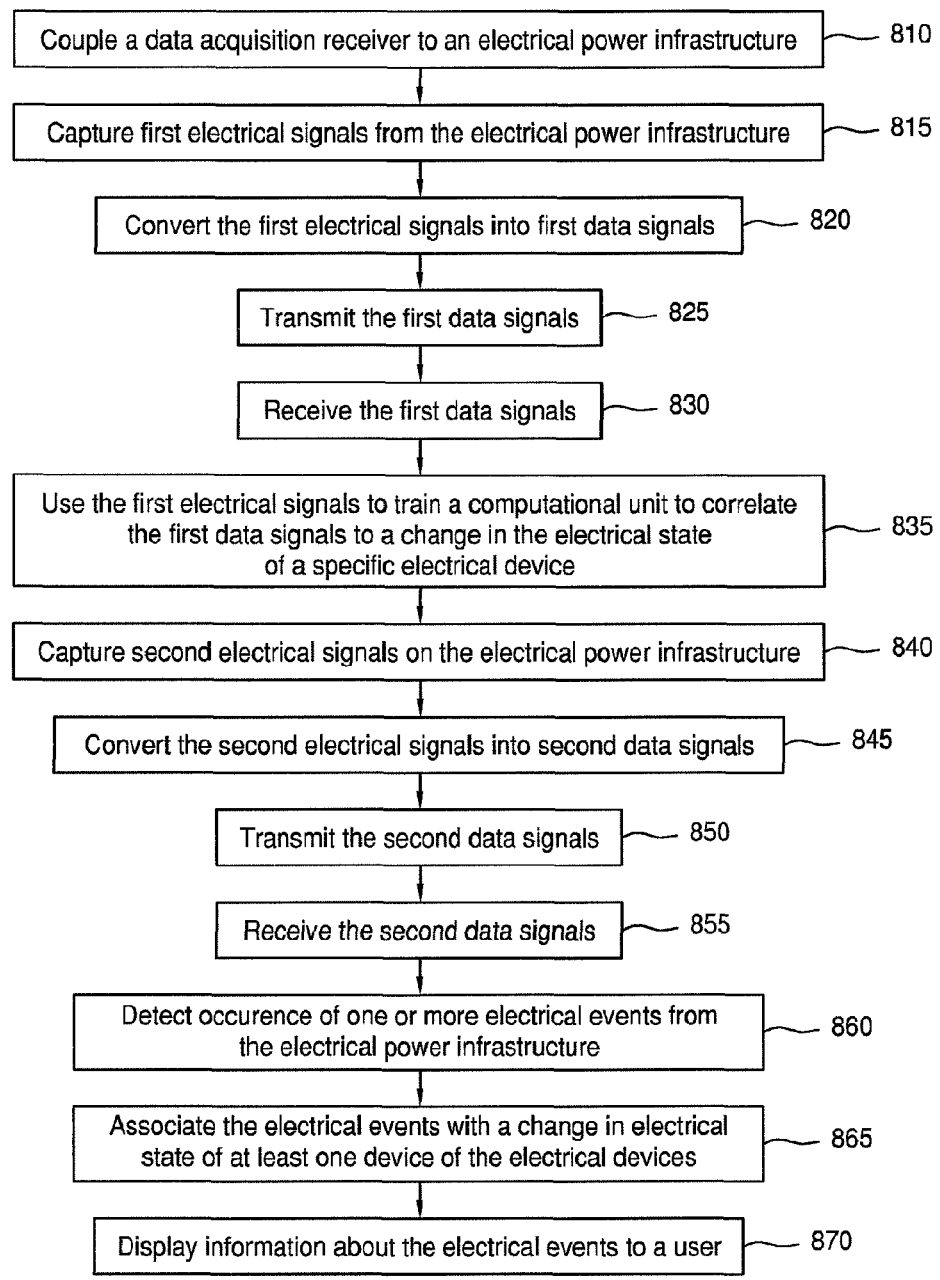
FIG. 8 illustrates a flow chart for an exemplary embodiment of a method of detecting and classifying electrical power usage by one or more electrical devices coupled to an electrical power infrastructure, according to an embodiment.

FIG. 8 illustrates a flow chart for an embodiment of a method 800 of detecting and classifying electrical power usage by one or more electrical devices coupled to an electrical power infrastructure, according to an embodiment. Method 800 is merely exemplary and is not limited to the embodiments presented herein. Method 800 can be employed in many different embodiments or examples not specifically depicted or described herein. In some embodiments, the activities, the procedures, and/or the processes of method 800 can be performed in the order presented. In other embodiments, the activities, the procedures, and/or the processes of the method 800 can be performed in any other suitable order. In still other embodiments, one or more of the activities, the procedures, and/or the processes in method 800 can be combined or skipped.

Referring to FIG. 8, method 800 includes an activity 810 of coupling a data acquisition receiver to an electrical power infrastructure. In some examples, the data acquisition receiver can include an electrical interface. The electrical interface can be configured to couple the electrical power infrastructure. For example, the electrical interface can be a two or three prong electrical plug, and the electrical plug can be coupled to an electrical wall socket of the electrical power infrastructure. In other examples, the data acquisition receiver can be coupled to an electrical breaker panel and/or utility wattmeter of a structure. In some embodiments, activity 810 can include coupling one data acquisition receiver to each phase of a two-phase electrical power infrastructure of a structure. In some examples, the data acquisition receiver and the electrical interface can be similar or identical to data acquisition receiver 211 and electrical interface 212, respectively, of FIG. 2. The data acquisition receiver can also be similar or identical to data acquisition receiver 611 of FIG. 6.

Method 800 in FIG. 8 continues with an activity 815 of capturing one or more first electrical signals from the electrical power infrastructure. In some examples, the electrical signal captured includes electrical noise, and more specifically, continuous electrical noise with the fundamental frequency. In various examples, the continuous electrical noise can include high-frequency electromagnetic interference (e.g., electrical signals in the tens to hundreds of kilohertz range). In many embodiments, the data acquisition receiver can capture the first electrical signals.

Subsequently, method 800 of FIG. 8 includes an activity 820 of converting the first electrical signals into one or more first data signals. In some examples, converting the first electrical signals can first include filtering the electrical signals using filter circuits and then converting the filtered signals into digital signals using a converter module. In various examples, a high pass filter can be applied to the first electrical signals to filter out, for example, the AC line frequency, harmonics of the AC line frequency, and/or other frequencies. Afterwards, the filtered electrical signals can be converted into the first data signals by feeding the filtered electrical signals into a converter module (e.g., an analog to digital converter), which, for example, can sample the filtered electrical signals at 1 MHz (megahertz). In some examples, the filter circuits and the converter module can be similar or identical to filter circuits 213 and converter module 214 of FIG. 2 and/or filter circuits 613 and converter module 614 of FIG. 6.

Next, method 800 of FIG. 8 includes an activity 825 of transmitting the first data signals. In some embodiments, the first electrical signals can be transmitted using a transmitter. As an example, the transmitter can be similar or identical to communications device 216 of FIG. 2 or communications device 616 of FIG. 6. In some examples, the transmitter can be a wireless transmitter. In other examples, the first data signals can be transmitted using a wire. In still further examples, the first data signal can be transmitted using a combination of wired and wireless communications. For example, the signal can be transferred from the data acquisition receiver to a hub over the electrical power lines and wirelessly transmitted from the hub to the computational unit.

Method 800 in FIG. 8 continues with an activity 830 of receiving the first data signals. In some embodiments, the first electrical signals can be received using a receiver. As an example, the receiver can be similar or identical to a receiver of communications device 221 of FIG. 2. In some examples, the receiver can be a wireless receiver. In other examples, the first data signals can be received by a wired receiver over a wire or received using a combination of wired and wireless receivers.

Figure 9:
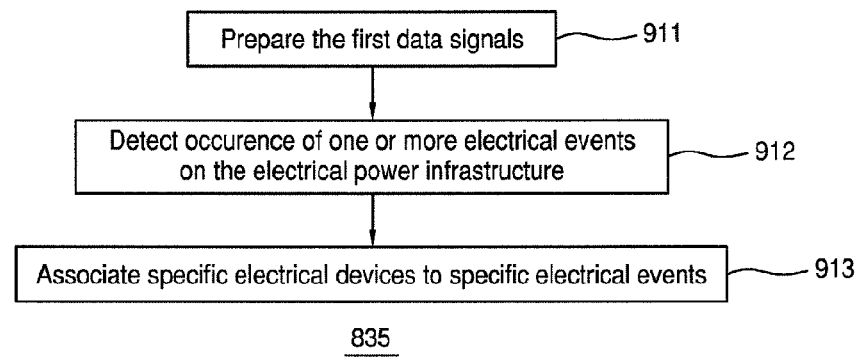
FIG. 9 illustrates a flow chart of an exemplary activity of using first electrical signals to train a processing module to correlate first data signals to a change in an electrical state of a specific electrical device, according to an embodiment.

Subsequently, method 800 of FIG. 8 includes an activity 835 of using the first electrical signals to train a processing module running on a computational module to correlate the first data signals to a change in the electrical state of a specific electrical device. FIG. 9 illustrates an exemplary flow chart of activity 835 of using the first electrical signals to train the processing module to correlate the first data signals to a change in the electrical state of a specific electrical device, according to an embodiment.

The first procedure in activity 835 of FIG. 9 is a procedure 911 of preparing the first data signals. In some examples, the first data signals are buffered as 2048-point vectors, and a fast-Fourier transforms (FFT) of the first data signals are computed to obtain the frequency domain signal. The 2048 points can be spread equally over a spectral width of 500 kHz, which yields a resolution of 244 Hz per FFT bin. The FFT vector or frequency vector is computed 244 times per second. In other examples, other sizes of FFT bins and numbers of point vectors can be used. In some embodiments, the preparation of the first data signals is performed by an event detection module. For example, the event detection module can be similar or identical to event detection module 224 of FIG. 2.

The next procedure in activity 835 of FIG. 9 is a procedure 912 of detecting an occurrence of one or more electrical events on the electrical power infrastructure. Most SMPS devices generate noise peaks that are 8 dB to 60 dB above a baseline noise floor of the first data signals. In most structures, the baseline noise floor can vary unpredictably between −90 dBm to −70 dBm across the entire spectrum. Because the variability of the baseline noise is high, the incoming frequency vector can be averaged over time to obtain to a stable noise floor. In some examples, a sliding window average with a window size of a predetermined amount (e.g., twenty-five) can be used. Using a window size that is too small can result in an increase in the false positives, whereas a large window size can increase the amount of time needed between near simultaneous events for the system to detect them as separate events.

Figure 10:
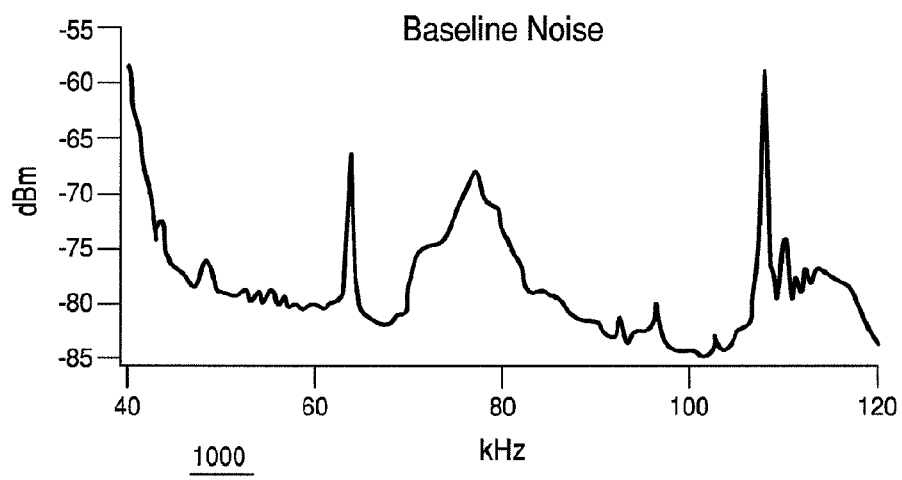
FIG. 10 illustrates a graph of an exemplary baseline noise signature of a structure, according to an embodiment.

In some examples, the event detection module can compute an average of the predetermined number of frequency vectors and stores it as the baseline noise signature in storage module 230 (FIG. 2). FIG. 10 illustrates a graph 1000 of an example of a baseline noise signature of a structure, according to an embodiment.

Figure 11:
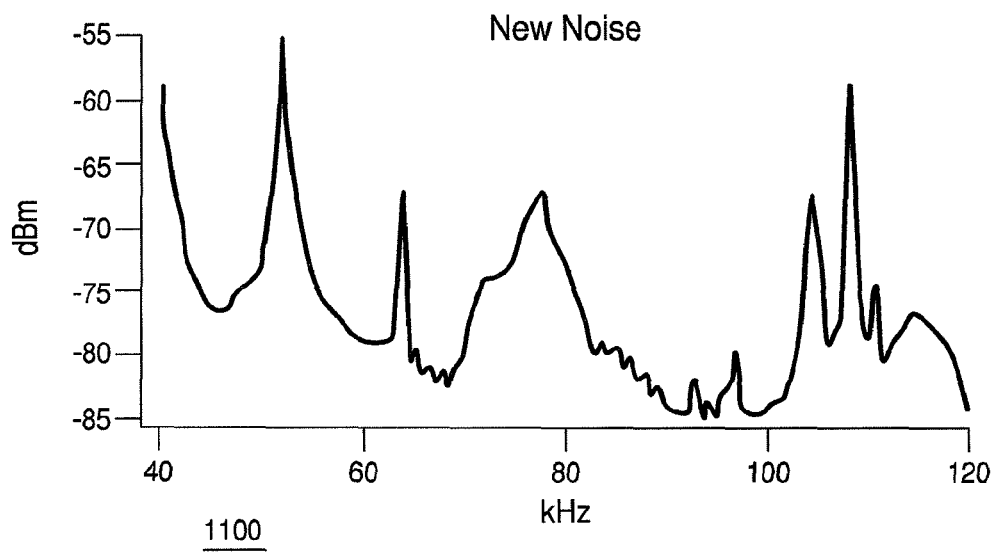
FIG. 11 illustrates a graph of an exemplary noise signature of a new device, according to an embodiment.
Figure 12:
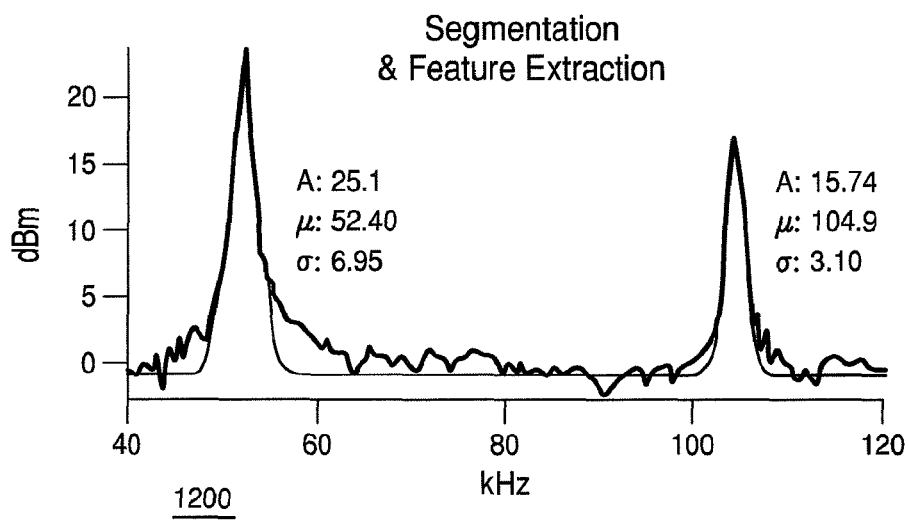
FIG. 12 illustrates a graph of an exemplary noise signature of the new electrical device after the baseline noise is removed, according to an embodiment.

Thereafter, a new window is calculated every predetermined number of frequency vectors, and a difference vector with the new baseline noise signature is computed. When an electrical device is actuated and new noise in the frequency domain is introduced to the power line infrastructure, the difference vector reflects this change. Thus, this difference vector allows segmentation of the event. FIG. 11 illustrates an example of a graph 1100 of a noise signature of a new device, according to an embodiment. FIG. 12 illustrates an example of a graph 1200 of a noise signature of the new electrical device after the baseline noise is removed, according to an embodiment.

In various embodiments, the event detection module can scan the difference vector to find any values that are greater than a predefined threshold. The event detection module can use a global threshold that is set once and is used in different structures. In some examples, a threshold of eight dB above the noise baseline can be a sufficient power threshold. Because the vectors in a window are averaged, if the window only partially overlaps with an event, the event detection module can still correctly detect it, but the difference vector will reflect a smaller magnitude. To mitigate this potential problem, when an event is detected, a new difference vector is calculated using the next window cycle. After the detection of an event, the baseline noise vector is updated appropriately so as to reflect the new noise floor of the electrical power infrastructure.

In many examples, the event detection module can find amplitude or frequency components above the threshold using the difference vector and can fit a Gaussian function to extract the mean, amplitude, and variance parameters. For example, FIG. 12 shows an exemplary amplitude (A), the mean ($\mu$), and variance ($\sigma$) of an electrical signal from a newly actuated device. The change in amplitude can be positive or negative depending on whether the device is being turned on or off. The noise signatures are the inverse of each other for opposite state transitions (i.e., turning on and turning off have inverse noise signatures).

A feature vector for the suspected event can be created by the event detection module using the parameters of the center frequency, which is generally the global maximum frequency component. Other peaks may also be present as harmonics. In many examples, the event detection module can apply KNN (k-nearest neighbor) (k=1) with a Euclidean distance metric and inverse weighting to create the feature vector.

Subsequently, activity 835 of FIG. 9 includes a procedure 913 of associating specific electrical devices to specific electrical events. In some examples, a training module can perform a training or calibration process with a user to create this association.

If the electrical event detection system employs a fingerprinting-based approach for device identification, it can require a training process to learn the parameters of various devices in a structure. In some examples, this training is generally accomplished by having the user actuate each device at least once.

In other examples, another source of information for the database of electrical noise signatures can be cloud sourcing. A central database can be maintained that is shared among all electrical event detection devices. When a user labels a new appliance, it becomes part of the common repository, allowing future queries to use the information to identify the new electrical device. For example, a user can access an online database of popular consumer electronic device signatures submitted by other users who have gone through a calibration process.

Additionally, because the sensed EMI is an engineered signal, it may be possible to generate such signature databases without physically actuating a device or having physical access to it. This can be realized by mining information from a device's U.S. Government FCC (Federal Communications Commission) compliance report and other technical datasheets, which list the frequency and raw magnitude in dBuV for various noise peaks that specific electrical devices emit.

For example, consumer electronic devices are required to pass certain certifications at, for example, the FCC, which ensures that the EMI they generate are within certain predefined limits. The outcome of the certification is a publicly available document that describes the electrical specifications and noise characteristics of the equipment. Information can be extracted from the publically available documents that can be used to build a database that contains the expected resonant frequencies for various appliances. Other sources for this information can be derived from mining the datasheets of the internal integrated circuits and oscillators found in consumer electronic devices.

Referring back to FIG. 2, computational unit 120 (FIG. 1) can store the results of the association or calibration process in storage module 230 (FIG. 2). This information can be later used to associate one or more noise signatures with specific electrical events.

In the same or different embodiments, storage module 230 can include a database of electrical noise signatures of electrical devices. In some examples, the electrical noise signatures of the electrical devices can be provided by a third party (e.g., the manufacturer of electrical event detection devices 100 (FIG. 1) and/or 500 (FIG. 5)).

In the same or different embodiments, the calibration process can involve a labeling process where a user of electrical event detection device 100 helps relate an electrical device to specific electrical events. In some embodiments, the training sequence involves a user of electrical event detection device 100 turning on and turning off each of the electrical devices (or at least turning on and turning off the electrical devices using SMPS in the home or other structure) while training module 223 is operating and recording electrical events on electrical power line infrastructure 150.

To identify electrical events, training module 223 (or event detection module 224) can apply a sliding window step detector, which continuously looks for changes in magnitude of the segmented data. Training module 223 (or event detection module 224) can trigger a step detector when it encounters a monotonically increasing or decreasing signal with a rate of change that is greater than a learned or predetermined threshold.

In some examples, the learned threshold is set to an arbitrarily large number and is decreased in small steps. For each step, training module 223 (or event detection module 224) can segment a random subset of events that occur in isolation. If the correct number of events is calculated, the threshold is accepted. If not, the threshold is decreased, and the process is repeated. For example, if the subset contains four events, there should be four step increases and four step decreases segmented. Training module 223 (or event detection module 224) can monotonically decrease the detection threshold until this pattern is seen. In this way, the learned threshold is set with minimal supervision or human involvement. In other embodiments, training module 223 can set the threshold amount to a predetermined amount (e.g., eight dB).

After cycling the power on each of the electrical devices, the user can label each electrical event detected by training module 223 using communications module 225. For example, if the user: (1) turns on and turns off a television; and (2) turns on and turns off each of four lights with fluorescent light bulbs in a room, the first two electrical events detected by electrical event detection device 100 can be labeled as the television being turned on and off, and the next eight electrical events can be labeled as turning on and turning off each of the lights. Similarly, a user can cycle on and off the electrical power to all electrical devices in the house or building and perform a similar labeling procedure.

In other examples, communications module 225 can include a portion that can run on a mobile electrical device (e.g., an iPhone® or iPad® device by Apple Computers, Inc. of Cupertino, Calif.) that allows a user to mark with a timestamp when a specific electrical event occurred. In these examples, a user can cycle on and off the mobile electrical power on all electrical devices in the structure while carrying the electrical device running the part of communications module 225. The user can use communications module 225 to mark when an electrical event occurs. For example, while training module 223 is operating and recording electrical events, the user can turn on a laptop computer and press a button on the electrical device that causes the electrical device to record the description of the electrical event and the time that the event occurred.

Training module 223 can correlate the data recorded by the mobile electrical device and electrical signals recorded by data acquisition receiver 211. In some examples, the mobile electrical device can relay the data immediately (e.g., in real time) to computational unit 120, and in other examples, the data can be communicated to computational unit 120 after the training process is complete (e.g., in batch mode).

In still further examples, a user can cycle on and off the electrical power to all electrical devices in the structure, and training module 223 can access electrical noise signatures of electrical devices stored in storage module 230 (or an online database) and automatically associate electrical events with the electrical noise signatures of specific electrical devices. In various embodiments, the user can input information about the electrical devices in the building (e.g., the manufacturer, the module number, and/or serial number) to help training module 223 associate electrical events with electrical noise signatures of the electrical devices in the structure. That is, training module 223 can compare the electrical noise signals detected by data acquisition receiver 211 (FIG. 2) with stored electrical noise signatures of the electrical devices in the building to associate the electrical events with specific electrical devices.

In various embodiments, instead of undertaking a training sequence, training module 223 or classification module 226 can access the database of electrical noise signatures when a new electrical device is actuated for the first time when electrical event detection device 100 is running. In this case, the electrical noise signature of the new electrical device can be compared against the electrical noise signatures database to find a matching signature.

In the same or different examples, if an electrical event cannot be identified using the electrical noise signatures database, the electrical event can be manually labeled. In some examples, training module 223 can classify an electrical device into a device category (e.g., television), and the user can provide the exact label (e.g., a Sony KDL-40V TV). If the user has a large number of such electrical devices, the user can switch on and off the electrical devices, and electrical event detection device 100 can generate a list with category labels that can be updated with information that is more accurate. After completing the association of specific electrical devices to specific noise signatures as part of procedure 911 in FIG. 9, activity 835 of FIG. 9 is complete.

Referring again to FIG. 8, method 800 continues with an activity 840 of capturing second electrical signals from the electrical power infrastructure. Activity 840 can be similar or identical to activity 815.

Method 800 in FIG. 8 continues with an activity 845 of converting the second electrical signals into second data signals. Activity 845 can be similar or identical to activity 820.

Subsequently, method 800 of FIG. 8 includes an activity 850 of transmitting the second data signals. Activity 850 can be similar or identical to activity 825.

Next, method 800 of FIG. 8 includes an activity 855 of receiving the second data signals. Activity 855 can be similar or identical to activity 830.

Method 800 in FIG. 8 continues with an activity 860 of detecting occurrences of one or more electrical events on the electrical power infrastructure. Activity 860 can be similar or identical to procedure 912 of FIG. 9. In this activity, an event detection module can locate peaks in the electrical signals that are above the predetermined threshold.

Subsequently, method 800 of FIG. 8 includes an activity 865 of associating the one or more electrical events with a change in electrical state of at least one electrical device of the one or more electrical devices. In some examples, the change in the electrical state of the electrical device can be from one of: (a) a complete power-off state (or a standby power state) to a power-on state; or (b) a power-on state to a complete power-off state (or standby power state).

In the same or different embodiments, the electrical events can be a change from a first state providing a first electrical power to the electrical device to a second state providing a second electrical power to the electrical device. In this example, the first electrical power is different from the second electrical power. In some embodiments, the first electrical power and the second electrical power are not power-off states.

Event detection module 224 (FIG. 2) can find peaks above the threshold using the difference vector and fits a Gaussian function to extract the mean, amplitude and variance parameters. Feature vectors are generated for each segmented event and then can be used to build a KNN model. The KNN model can be used to automatically determine the source of the electrical events. Event detection module 224 (FIG. 2) can apply KNN (k=1) of a Euclidean distance metric and inverse weighting.

In the same or different examples, after event detection module 224 (FIG. 2) locates a peak in the electrical signal from data acquisition receiver 211 (FIG. 2), event detection module 224 can extract three features from the signal: (1) the relative magnitude of the step change; (2) the slope of the change-in-flow; and (3) the rise or fall time of the unknown event. These three features can be useful in disambiguating electrical devices.

Event detection module 224 (FIG. 2) can use the information gathered about the electrical event to associate it with a specific electrical device. For example, event detection module 224 (FIG. 2) can compare the signature of the electrical event to the signatures saved from the training process to determine which electrical device caused the event and the type of event.

Next, method 800 of FIG. 8 includes an activity 870 of displaying information about the one or more electrical events to a user. In some examples, communications module 225 (FIG. 2) can display information about the one or more electrical events to the user. The information can be displayed in a variety of forms. In some embodiments, the electrical state of two or more electrical devices in the structure for a specific time period can be presented to the user in chart form. In some embodiments, information about the one or more electrical events can be displayed in real-time. After activity 870, activities 840, 845, 850, 855, 860, 865, and 870 can be repeated each time a new electrical event occurs to identify the electrical event. Using these activities, a system can detect and classify electrical power usage by one or more electrical devices.

The results of testing of an exemplary embodiment of electrical event detection device 100 are presented herein. As will be described below in detail, the result of testing an exemplary embodiment of electrical event detection device 100 (FIG. 1) had a mean classification accuracy of 93.82% when identifying and classifying continuous noise electrical events at an individual electrical device level (e.g., a particular television, laptop computer, or CFL lamp).

The exemplary embodiment of electrical event detection device 100 was tested on a 120V, 60 Hz electrical infrastructure. However, electrical event detection device 100 (FIG. 1) can easily be applied to an electrical infrastructure utilizing different frequency and voltage rating with minor changes to the hardware and to the software. For structures that have split phase wiring (i.e., two 120 V branches that are 180-degrees out of phase), in some examples, the crosstalk between the two phases allows electrical event detection device 100 (FIG. 1) to continue to monitor at a single location and capture events on both phases.

Applications were conducted in seven different structures using an exemplary embodiment of electrical event detection device 100 (FIG. 1). Data was collected from one structure for a longer period of time (i.e., six months) and from multiple other buildings for a shorter period. This approach showed the general applicability of electrical event detection device 100 (FIG. 1) to a diverse set of structures as well as the long-term temporal stability of electrical event detection device 100 (FIG. 1). FIG. 13 illustrates a table 1300 of demographic data for the structures used in the exemplary deployment of an exemplary embodiment of electrical event detection device 100, according to an embodiment.

For each structure, an available electrical outlet with two electrical sockets was picked at random. An exemplary sensing unit 110 was plugged into one electrical outlet 151 and the other electrical outlet used to power computational unit 120 (FIG. 1). Computational unit 120 (FIG. 1) generates EMI noise, but this EMI noise is subtracted out as part of the baseline noise. After the installation, notes were made of every electrical device in the structure that incorporated a switching power supply. This list included incandescent lights that were driven by a dimmer switch in addition to any light fixtures with CFL bulbs. For dimmers, events were only collected at 0% and 100% dim levels, because of the challenge of accurately and repeatedly setting intermediate dim levels. More analysis on dimmers is presented later. The collected labels were then fed into ground truth labeling software.

The electrical devices in the structures were tested in two phases. In the first phase, each appliance was actuated on and off five to six times individually to ensure that an isolated signature for each appliance was captured. Every time the electrical event detection system detected an event (i.e., when the electrical device was turned on), the features were automatically extracted and sent to the ground truth labeling software's queue. As events were being captured, those events were labeled using the ground truth labeling software. This process was carried out for all of the electrical devices in the structure.

For the second phase of data collection in each structure, the goal was to collect data under a naturalistic setting where overlapping and simultaneous events could occur. To create the more naturalistic setting, the owners of the structure were asked to perform certain activities, such as watch TV, prepare a meal, etc., while random appliances and/or logical groups of appliances were actuated. For example, a DVD player, digital cable box, and a gaming console were turned on, and then a TV was turned on to simulate a TV watching experience through a universal remote.

In addition to the electrical devices already found in each of the test structures, data was collected from the same laptop power adaptor, the same two CFL, and the same camera charger in each of the structures. To simulate a naturalistic use of each device, these electrical devices were moved around in the structures and plugged into any available outlet. This allowed analysis of the stability of these noise signatures across different structures to be performed.

The data collected by the ground truth labeling software was time stamped, labeled, and stored in an XML (extended markup language) database. Since more features than required were collected by these tests, the XML database allows easy filtering and parsing of the data to generate output data in a format that can be directly imported and processed.

To test the temporal stability and long-term feasibility of the electrical event detection device, the exemplary embodiment of the electrical event detection device was deployed at one of the structures for over six months. Events were collected and labeled throughout this entire period manually using a slight variant of the ground truth-labeling tool that was used in other structures. Every time an event was detected, the logging tool would put the extracted features in a queue and generate an audible beep. The structure occupants were instructed to label the events with the electrical appliance they actuated using the labeling tool.

The labeling tool was designed to have a highly streamlined interface, requiring only the selection of device labels from an onscreen selection list. If the user did not label an event in the queue for more than six minutes, it was labeled as unknown and purged from the queue. This feature allowed the occupants to handle any erroneously detected events and ignore events when the occupants were unable to attend to the labeling tool promptly. Though a convenient feature, this feature also meant that labels were lost on actual events that the occupant missed or decided to ignore. However, the intent of this application was to gather as many ground truth labels as possible for an extended period of time.

A total of 2,576 electrical events were collected from the seven structures. The largest number of events came from lighting, which tended to be either CFL- or dimmer-based. Most of the other detectable devices were common consumer electronic devices, such as LCD (liquid crystal display) or LED (light emitting diode) televisions, gaming consoles, personal computers, power adaptors, etc.

Appliances such as dryers and electric stoves did not appear to generate events in some of the test structures. Generally, such devices are large resistive loads and hence do not emit any high-frequency noise. Continuous noise events were observed from a washer in home H7 because only home H7 had a modern Energy Star compliant high efficiency washer that generated continuous noise. The continuous electrical noise was from its electronically controlled DC (direct current) motor powered through a SMPS. In addition, for most large appliances, the use of a SMPS is considered negligible compared to the overall power consumption for the appliance.

To determine the performance of classifying the actuation of electrical devices in a structure, the classification method was evaluated using two different procedures. In the first procedure, the performance of our KNN-based classifier was evaluated using a 10-fold cross validation for each structure. In the second evaluation, a minimal training set (a single training example for each device of interest) was used in order to simulate a more practical and real-world situation. FIG. 14 illustrates a table 1400 showing the performance of an exemplary electrical event detection system during an exemplary deployment, according to an embodiment. Using 10-fold cross validation, an overall average accuracy of 91.75% was observed.

Figures 15, 16:
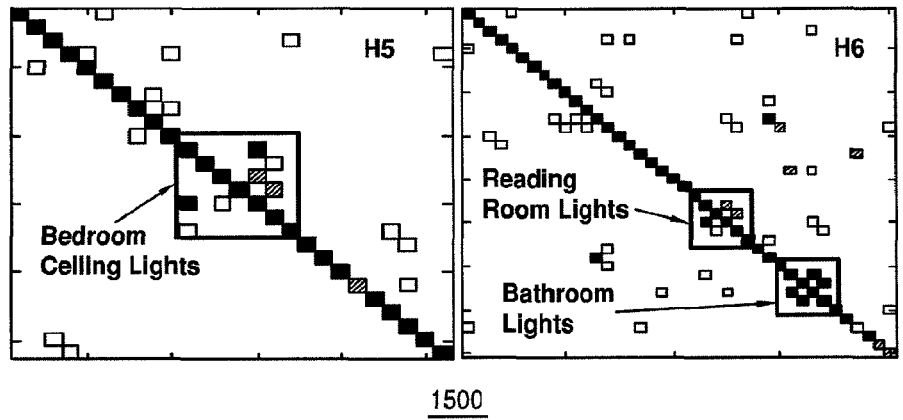
FIG. 15 illustrates a confusion matrix table showing the performance of an exemplary electrical event detection system during an exemplary deployment, according to an embodiment.
FIG. 16 illustrates another table summarizing the classification accuracies when using a minimal training data set of an exemplary electrical event detection system during an exemplary deployment, according to an embodiment.

Upon analyzing the confusion matrices for each of the structures, it was found that for both H5 and H6, there was confusion between some of the lighting devices. FIG. 15 illustrates a confusion matrix table 1500 showing the performance of an exemplary electrical event detection system during an exemplary deployment, according to an embodiment. From the data, it was observed that the processing module correctly identified similar light fixtures (i.e., the same model and brand) that were located in different rooms. However, homes H5 and H6 had rooms where the same models of fluorescent light fixtures were installed spatially near each other (1-2 feet apart), which produced very similar noise signatures. Thus, these particular lights did not have sufficient differences nor were they far apart enough along the power line infrastructure to differentiate between those lights.

Use of hardware with a higher frequency resolution may partially alleviate this problem. Also, for some applications, logically combining or clustering the lighting that are spatially co-located might be acceptable. Using this latter approach, the performance of an exemplary electrical event detection system during an exemplary deployment after clustering the same model of lights or devices that are 1-2 feet apart from each other as a single event was improved. This approach yields an increase in classification accuracy for H5 (92.4%) and H6 (91.8%), for an average overall accuracy of 93.82%.

The lower accuracy of home H2 was due to confusion between two devices of the same brand that were on the opposite phase of the installation point of electrical event detection device 100. Part of the second floor in home H2 exhibited very weak coupling between the electrical phases, which required us to plug in electrical event detection device 100 in that phase and thus causing some of the signatures to look very similar. This problem can be addressed by, for example, using two different electrical event detection devices 100 with one on each of the two phases, or installing a single electrical event detection device 100 at a split-phase 240 V outlet.

Because N-fold cross validation is generally optimistic and is not a true measure of the expected classification performance for a real world system, a follow-up analysis was performed using a minimal training set, i.e., a single event signature for each device to model and then apply it to a test set. For example, an owner of a structure would likely be only willing to provide a few training events for each appliance. FIG. 16 illustrates another table 1600 summarizing the classification accuracies when using a minimal training data set of an exemplary electrical event detection system during an exemplary deployment, according to an embodiment. Using this validation approach, an accuracy was found to be 89.25%

Because no two structures have the exact same electrical infrastructure and can have drastically different baseline noise present on the power line, the portability of noise signatures across structures was also examined.

Two applications were implemented that together suggest that a learned signal for an electrical device in one structure can be used to classify a similar electrical device in another structure. In the first application, the EMI signal of a device was shown to be independent of the structure in which it is used. Accordingly, the signal is intrinsic to the electrical device's functioning. Second, the EMI signal was shown to be consistent to within the variance limits for multiple, but similar devices. That is, the EMI signals from the same brand and model of devices are substantially similar.

Figures 17, 18:
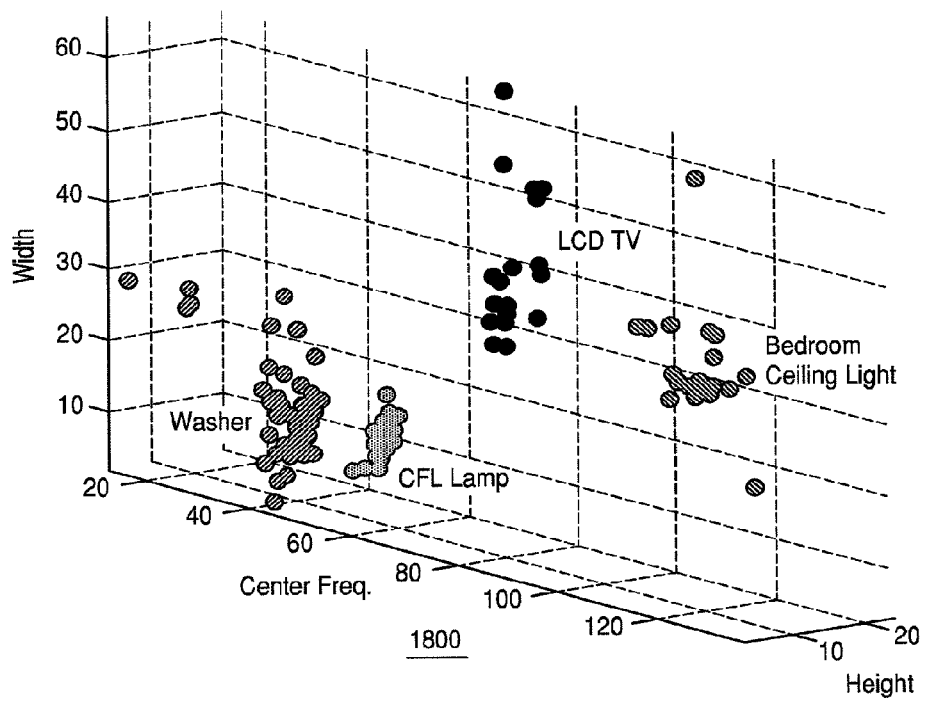
FIG. 17 illustrates a table of the performance of an exemplary event detection system of classifying four electrical devices used across different structures using a 10-fold validation classification, according to an embodiment.
FIG. 18 illustrates a graph showing the temporal stability or variation of signatures over time for four randomly chosen electrical devices by visualizing the feature vectors in the feature space, according to an embodiment.

The first application involved collecting data each of the four preselected devices in each of the seven structures. This application showed the signal portability through classification results across structures. The average accuracy of the ten trials for a 10-fold cross validation test was 96.87%. For three of the four devices, the classification accuracy was 100%. This result strongly suggests that these devices generated similar signals. Only one device, the laptop power adapter, performed poorly. FIG. 17 illustrates a table 1700 of the performance of four electrical device used across different structures using a 10-fold validation classification, according to an embodiment.

The laptop power adaptor was harder to identify because the specific extracted feature vector for this device in home H6 looked slightly different from the other structures. However, upon closer inspection, the noise generated by the laptop power adaptor had a harmonic peak that was very close in amplitude to the center frequency. This marginal difference caused the processing module to assign the first harmonic as the center frequency in H6, and thus extracting a different feature vector. A simple approach to alleviate this problem is by employing a classification module that classifies an event only if the distance between the event feature vector and the nearest neighbor in KNN is greater than a certain threshold. If not, the classification module can build a new feature vector from the next strongest peak. Using this new method, classification accuracy for the laptop was 100%.

In the second application, data was collected for eight 20-inch Dell® LCD monitors that were of the same model. This LCD model was also coincidently found in homes H5 and H7. The EMI signature for one of monitors was swapped for the EMI signature of the other nine monitors obtained from a different structure or other building. For example, the processing module was trained using the signature from home H7 and tested in home H5. This test ensured that if the signatures for any of the LCD monitors were different it would be misclassified as another device. All of the tests yielded 100% accuracy, suggesting that similar make and model devices produce similar signatures.

Moreover, for any signature or fingerprint-based classification system, temporal stability is important. The classification module should perform well for months (or ideally, years) without requiring frequent re-training, which necessitates that the underlying features remain stable over time.

To show the stability of the noise signatures over time, electrical devices were chosen from our long-term deployment dataset, that met two criteria: (1) the devices were fixed in their location during the duration of the deployment, and (2) the devices were not altered in any way (e.g., light bulbs were not replaced). For these devices, randomly selected EMI signature vectors spread over the period of the 6-month evaluation were extracted.

FIG. 18 illustrates a graph 1800 shows the temporal stability or variation of the signatures over time for four randomly chosen devices by visualizing the feature vectors in the feature space, according to an embodiment. It was observed that the long-term temporal variation was similar to what was observed in the short-term temporal variation in these electrical devices and that none of the clusters overlapped.

To better understand how temporal variation effects the classification accuracy over time, test sets were generated for each electrical device consisting of all events that happened more than one week prior to the last day of the deployment, and a training set was generated to consist of electrical events from all electrical devices that happened in the last week. This setup ensured that, if the continuous noise signatures in the test set deviated more than the distance between the electrical device clusters, the processing module would see misclassifications. The tests showed a 100% accuracy using a KNN classifier, which indicates that the electrical devices are largely stable over a long period of time. It is important to note that this long-term application was straddling the summer and winter seasons.

Having a number of similar devices is a common occurrence in a structure, such as having multiple TVs or, more commonly, lights that all use the same brand CFL bulbs. This multiple identical devices can cause problems, especially if similar devices cannot be grouped into a single combined group. For example, grouping two ceiling lights in a bedroom may be acceptable, but grouping lights that are in different rooms or floors may not be.

Figure 19:
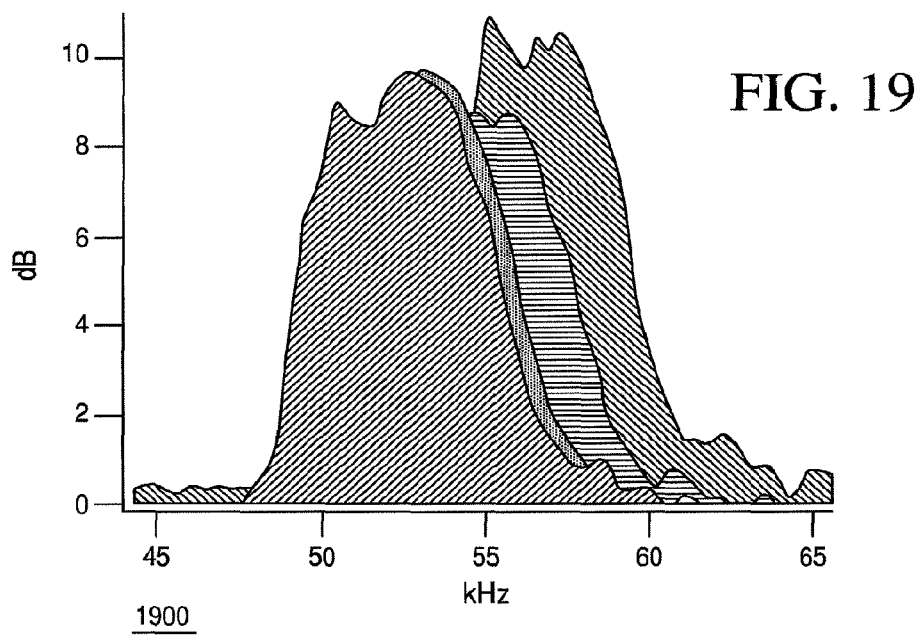
FIG. 19 illustrates a graph of the spectrum observed by an electrical event detection system, showing the spectra of the noise generated by four CFL (compact fluorescent light bulb) of the same model, according to an embodiment.

The component tolerances in components that make up the switching circuitry of electrical devices usually introduce enough variability in switching frequency such that the mean of the Gaussian fit observed on the power line infrastructure are also shifted. FIG. 19 illustrates a graph 1900 of the spectrum observed by electrical event detection system showing the spectra of the noise generated by four CFL lamps of the same model that were purchased as a pack of four, according to an embodiment. Using lights purchased as a pack ensures that the lights came from the same manufacturing batch. Note that the spectra do not overlap even among the same batch of CFLs.

The electrical event detection system is able to discern these features only when observed in isolation, i.e., a line isolation transformer was used to create a noise free power line for this particular application. With higher ADC resolution and a larger FFT, this shortcoming can be overcome. Thus, increased resolution may give us better differentiability.

As the conducted EMI travels through the power line, it is affected in several ways, but most prominently, the electrical signal is attenuated as a function of the line inductance between the source of noise and the point of sensing. Thus, two identical devices generating identical EMI may look different at the sensing source depending on where the devices are attached along the power line, which was observed in the in-structure applications.

Figure 20:
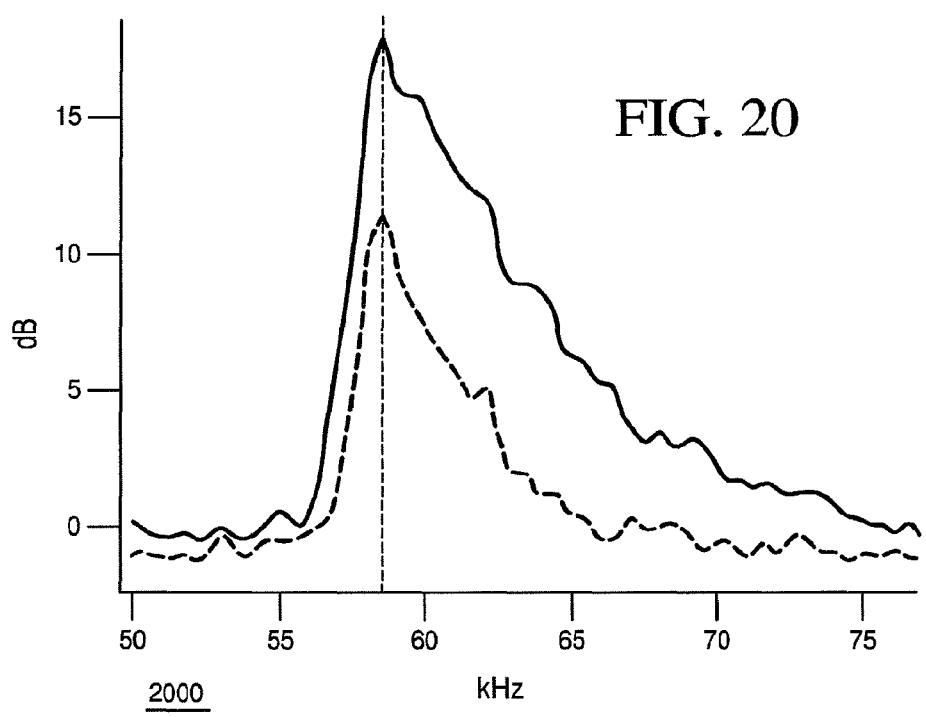
FIG. 20 illustrates a graph of a spectrum of a portion of the data from a test of an electrical device that was plugged into two different wall outlets of a building, according to an embodiment.

To confirm this, an electrical device was plugged in two different locations in a structure and logged the raw spectrum data as sensed by the electrical event detection system. FIG. 20 illustrates a graph 2000 of a spectrum of a portion of the data from a test of an electrical device that was plugged in two different locations, according to an embodiment. The consistency of the mean or location of the peak along with its associated Gaussian parameters extracted from the shape allowed correct identification of a mobile appliance, such as a laptop adapter, despite changes in the amplitude of observed features. In addition, within a structure, similar devices located in various parts of the structure can be differentiated by observing the characteristic shape of the electrical device's EMI spectrum. This result suggests that the number of fixed devices present in the structure (i.e., the number of CFL lights in the house or the number of a particular type of TV) can be determined.

The probability of two different types of devices having the same Gaussian fit mean and variance is very small. At most, the probability can be 1/(FFT Size), which is the probability of two electrical devices having the same mean frequency. With 2,048 as our FFT size, this probability is 0.05%. In practice, because the location and the parameters of a fitted Gaussian are used, the true probability is likely much lower.

Figure 21:
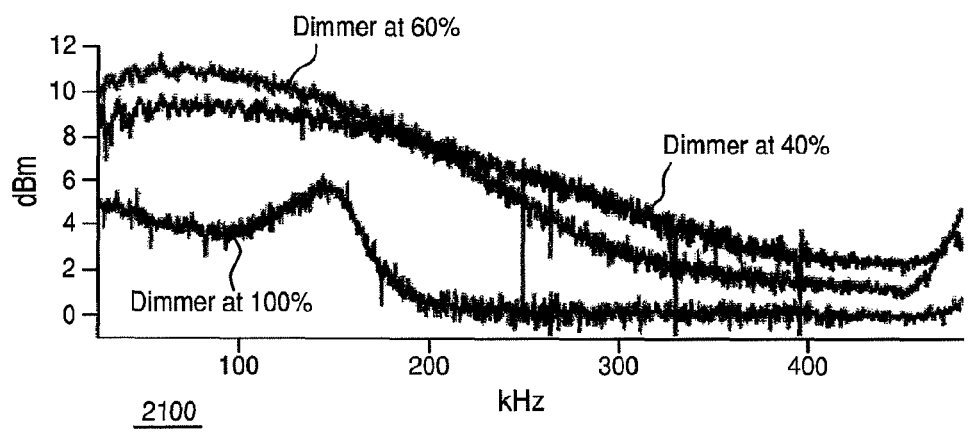
FIG. 21 illustrates a graph of an electromagnetic interference signal generated by a dimmer at various dimmer levels, according to an embodiment.

Unlike SMPS based devices, dimmers generate a wide band signal from their internal triac switches. The electrical event detection system can be designed to use a Gaussian fit in the feature extraction phase. Thus, the broadband noise emitted by a dimmer is modeled with a Gaussian distribution, even though a band-limited uniform distribution would be more appropriate. It was found that for dimmer controlled devices, Gaussian fits with a large variance were observed. FIG. 21 illustrates a graph 2100 of the EMI signal generated by a dimmer at various dim levels, according to an embodiment.

The difference in the noise signature generated at various dimmer levels allows electrical event detection device 100 (FIG. 1) to identify a dimmer as well as infer the dimmer level. Because it is not possible to train at different levels, a model for the noise characteristic can be built, and how the noise characteristics affected by the dimmer level or conduction angle of the triac can be determined.

Figure 22:
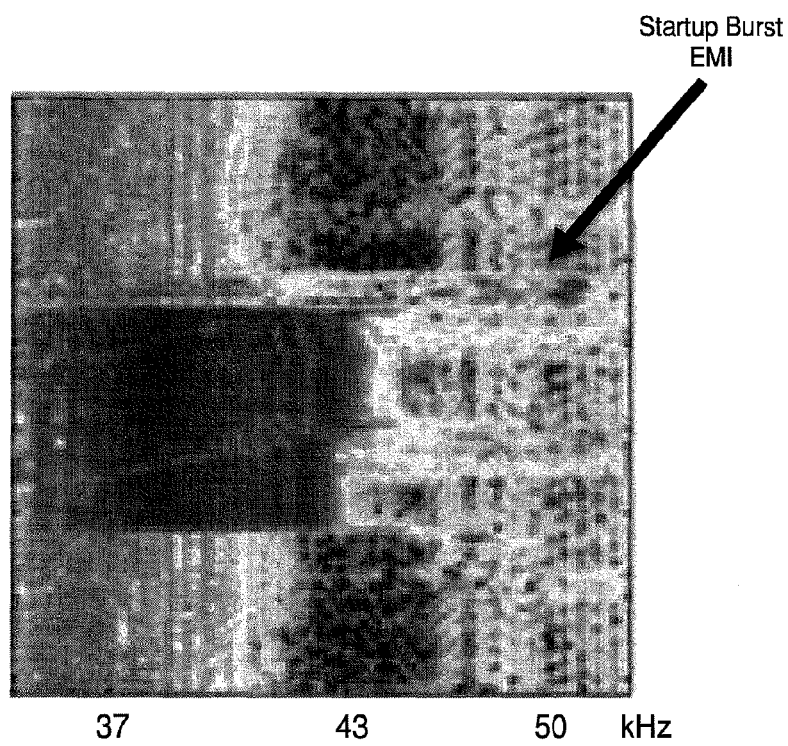
FIG. 22 illustrates a graph showing a short burst of electromagnetic interference that exemplary CFL lamps produce when first powered up.

The performance and robustness of a classification module is only as good as the features being used, so it can be desirable to explore and extract more advanced features from the underlying signals. Multiple other potentially useful features that could be used by the classification module exist. For example, several devices produce a characteristic EMI pattern that lasts for a short time when they are switched on. That is, these electrical devices produce narrow band transient EMI while the SMPS is starting up. These transients are at lower frequency. FIG. 22 illustrates a graph 2200, which shows a short burst of EMI that exemplary CFL lamps produce when first powered up. The short burst comes from the ignition circuitry in a CFL, which is required to warm the lamp up for operation. Similarly, other devices such as modern TVs and DVD players that have multiple power supplies and supporting electronics also produce start up noise signatures that can provide additional information for determining the category of the electrical devices. In another example, the modulation of the SMPS to control backlighting, which can be used to infer channel changes and the content appearing on the television.

In some examples of electrical event detection device 100 (FIG. 1), computational unit 120 (FIG. 1) assumes that the mean or location of EMI peaks does not change when the device is operational. This assumption may not be true for certain types of devices. For example, in a particular brand of LCD TVs, the switching frequency of its power supply is a function of the screen brightness. Thus, for this brand of LCD TV, the mean of EMI peaks shifts as the content on the screen changes. In some examples, computational unit 120 (FIG. 1) can lock onto the time varying noise peak and extract temporal features or templates from this data.

Additionally, certain motor-based devices such as a washing machine or a dishwasher generate low frequency periodic noise patterns in their motor controllers, which could be used to identify the device and its state. For example, in home H7, it was observed that the washing machine in its wash cycle produced intermittent noise at roughly 0.1 Hz in contrast to constant noise while in its spin cycle. Such features can be used by the computational module to build a finite state machine or a statistical model for more detailed classification.

Various examples of the electrical event detection device can detect near simultaneous events, i.e., events as close as 102 milliseconds (ms). That is, two events that occur more than 102 ms apart can successfully be detected as separate events by various examples of the electrical event detection device using one particular sampling frequency and averaging window size. If simultaneous events happen in shorter than 102 ms duration when using these various examples of the electrical event detection device, the separate electrical events are detected as a single event, and the features extracted are a collection of features from multiple devices. Thus, the underlying features remain intact, but are reported as one event. The computational module can use a different classification approach to separate out these compounded features and identify individual devices.

FIG. 23 illustrates an exemplary embodiment of a computer system 2300 that is suitable for implementing an embodiment of at least a portion of electrical event detection device 100 (FIG. 1). Computational unit 120 (FIG. 1) can include one or more of computer system 2300. Computer system 2300 includes a chassis 2302 containing one or more circuit boards (not shown), a USB (universal serial bus) port 2312, a Compact Disc Read-Only Memory (CD-ROM) and/or Digital Video Disc (DVD) drive 2316, and a hard drive 2314. A representative block diagram of the elements included on the circuit boards inside chassis 2302 is shown in FIG. 24. A central processing unit (CPU) 2410 in FIG. 24 is coupled to a system bus 2414 in FIG. 24. In various embodiments, the architecture of CPU 2410 can be compliant with any of a variety of commercially distributed architecture families.

System bus 2414 also is coupled to memory 2408 that includes both read only memory (ROM) and random access memory (RAM). Non-volatile portions of memory 2408 or the ROM can be encoded with a boot code sequence suitable for restoring computer system 2300 (FIG. 23) to a functional state after a system reset. In addition, memory 2408 can include microcode such as a Basic Input-Output System (BIOS). In some examples, storage module 230 (FIG. 2) can include memory 2408, USB (universal serial bus) port 2312, hard drive 2314, and/or CD-ROM or DVD drive 2316.

In the depicted embodiment of FIG. 24, various I/O devices such as a disk controller 2404, a graphics adapter 2424, a video controller 2402, a keyboard adapter 2426, a mouse adapter 2406, a network adapter 2420, and one or more other I/O device adapters 2422 can be coupled to system bus 2414. Keyboard adapter 2426, disk controller 2404, and mouse adapter 2406 are coupled to a keyboard 2304 (FIGS. 23 and 24), USB port 2312 (FIGS. 23 and 24), and a mouse 2310 (FIGS. 23 and 24), respectively, of computer system 2300 (FIG. 23). While graphics adapter 2424 and video controller 2402 are indicated as distinct units in FIG. 24, video controller 2402 can be integrated into graphics adapter 2424, or vice versa, in other embodiments. Video controller 2402 is suitable for refreshing a monitor 2306 (FIGS. 23 and 24) to display images on a screen 2308 (FIG. 23) of computer system 2300 (FIG. 23). Disk controller 2404 can control hard drive 2314 (FIGS. 23 and 24), and CD-ROM or DVD drive 2316 (FIGS. 23 and 24). In other embodiments, distinct units can be used to control each of these devices separately.

Although many other components of computer system 2300 (FIG. 23) are not shown, such components and their interconnection are well known to those of ordinary skill in the art. Accordingly, further details concerning the construction and composition of computer system 2300 and the circuit boards inside chassis 2302 (FIG. 23) need not be discussed herein.

When computer system 2300 in FIG. 23 is running, program instructions stored on a USB device in USB port 2312, on a CD-ROM or DVD in CD-ROM and/or DVD drive 2316, on hard drive 2314, or in memory 2408 (FIG. 24) are executed by CPU 2410 (FIG. 24). A portion of the program instructions, stored on these devices, can be suitable for carrying out methods 800 of FIG. 8.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activities 710, 715, 720, 725, and 730 of FIG. 7, activities 810, 815, 820, 825, 830, 835, 840, 845, 850, 855, 860, 865, and 870 of FIG. 8, and procedures 911-913 of FIG. 9 may be comprised of many different activities, procedures and be performed by many different modules, in many different orders, that any element of FIGS. 1-2 and 4-6 may be modified and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An apparatus configured to detect an electrical state of one or more electrical devices, the one or more electrical devices are coupled to an electrical power infrastructure and generate high-frequency electrical noise on the electrical power infrastructure, the apparatus comprises:
   a processing module configured to run on a processor of a computational unit; and
   a sensing device configured to be coupled to an electrical outlet, the sensing device comprising:
      a data acquisition receiver configured to receive the high-frequency electrical noise via the electrical outlet and convert the high-frequency electrical noise into one or more first data signals when the sensing device is coupled to the electrical outlet,
   wherein:
   the electrical outlet is electrically coupled to the electrical power infrastructure;
   the sensing device is in communication with the computational unit;
   the processing module is further configured to identify the electrical state of the one or more electrical devices at least in part using the one or more first data signals;
   the high-frequency electrical noise comprise substantially continuous electrical noise on the electrical power infrastructure in a ten kilohertz to three megahertz range; and
   the substantially continuous electrical noise comprises (a) first electrical noise that is identifiable on the electrical power infrastructure for a first length of time that is greater than one alternating current electrical cycle, or (b) second electrical noise that is identifiable on the electrical power infrastructure for a second length of time that is less than one alternating current electrical cycle but the second electrical noise are repeated in three or more alternating current electrical cycles.

2. The apparatus of claim 1, wherein:
the processing module is further configured to determine electrical power consumed by the one or more electrical devices at least in part using the one or more first data signals.

3. The apparatus of claim 1, wherein:
the high-frequency electrical noise are generated by one or more switch mode power supplies; and
the one or more electrical devices comprise the one or more switch mode power supplies.

4. The apparatus of claim 1, wherein:
the data acquisition receiver comprises:
   an analog-to-digital converter; and
   a filter configured to pass the high-frequency electrical noise.

5. The apparatus of claim 1, wherein:
the processing module is configured to identify when a first one of the one or more electrical devices is turned on or turned off by using at least in part the one or more first data signals.

6. The apparatus of claim 1, wherein:
the processing module is further configured to identify the electrical state of the one or more electrical devices using the one or more first data signals and data from at least one of:
a first database from a regulatory agency;
a second database, the second database is storing data regarding previously observed data signals;
one or more labels of the one or more electrical devices; or
user identification of the one or more electrical devices.

7. The apparatus of claim 1, wherein:
the processing module comprises:
   an event detection module configured to use the one or more first data signals to determine whether one or more electrical events have occurred;
   a classification module configured to determine the electrical state of the one or more electrical devices using the one or more electrical events; and
   a training module configured to correlate a first type of event with a first event of the one or more electrical events and a second type of event with a second event of the one or more electrical events.

8. The apparatus of claim 1, wherein:
the substantially continuous electrical noise comprises high frequency signals that are generated by at least one oscillator contained within at least one of the one or more electrical devices.

9. An apparatus configured to detect an electrical state of one or more electrical devices, the one or more electrical devices are coupled to an electrical power infrastructure and generate high-frequency electrical noise on the electrical power infrastructure, the apparatus comprises:
   a processing module configured to run on a processor of a computational unit; and
   a sensing device configured to be coupled to an electrical outlet, the sensing device comprising:
      a data acquisition receiver configured to receive the high-frequency electrical noise via the electrical outlet and convert the high-frequency electrical noise into one or more first data signals when the sensing device is coupled to the electrical outlet,
   wherein:
   the electrical outlet is electrically coupled to the electrical power infrastructure;
   the sensing device is in communication with the computational unit;
   the processing module is further configured to identify the electrical state of the one or more electrical devices at least in part using the one or more first data signals;
   the high-frequency electrical noise comprise electrical noise in a ten kilohertz to three megahertz range;

the processing module is further configured to determine a baseline noise signature of the one or more first data signals;

the processing module is further configured to determine one or more amplitude or frequency components in the one or more first data signals that are a predetermined threshold amount above the baseline noise signature of the one or more first data signals; and the processing module is further configured to associate at least one electrical device with the one or more amplitude or frequency components in the one or more first data signals.

10. An apparatus configured to detect an electrical state of one or more electrical devices, the one or more electrical devices are coupled to an electrical power infrastructure and generate high-frequency electrical noise on the electrical power infrastructure, the apparatus comprises:

a processing module configured to run on a processor of a computational unit; and a sensing device configured to be coupled to an electrical outlet, the sensing device comprising:

a data acquisition receiver configured to receive the high-frequency electrical noise via the electrical outlet and convert the high-frequency electrical noise into one or more first data signals when the sensing device is coupled to the electrical outlet, wherein:

the electrical outlet is electrically coupled to the electrical power infrastructure;

the sensing device is in communication with the computational unit;

the processing module is further configured to identify the electrical state of the one or more electrical devices at least in part using the one or more first data signals;

the high-frequency electrical noise comprises substantially continuous electrical noise on the electrical power infrastructure in a ten kilohertz to three megahertz range; and the substantially continuous electrical noise comprises high frequency signals that are cyclostationary with respect to an alternating current electrical cycle of the electrical power infrastructure.

11. The apparatus of claim 10, wherein:
the processing module is configured to identify when a first one of the one or more electrical devices is turned on or turned off by using at least in part the one or more first data signals.

12. The apparatus of claim 10, wherein:
the processing module comprises:
an event detection module configured to use the one or more first data signals to determine whether one or more electrical events have occurred;
a classification module configured to determine the electrical state of the one or more electrical devices using the one or more electrical events; and
a training module configured to correlate a first type of event with a first event of the one or more electrical events and a second type of event with a second event of the one or more electrical events.

13. The apparatus of claim 10, wherein:
the processing module is further configured to identify the electrical state of the one or more electrical devices using the one or more first data signals and data from at least one of:
a first database from a regulatory agency;
a second database, the second database storing data regarding previously observed data signals;
one or more labels of the one or more electrical devices; or
user identification of the one or more electrical devices.

14. A method of detecting and classifying electrical power usage by one or more electrical devices, the one or more electrical devices are coupled to an electrical power line, the method comprising:

capturing two or more electrical signals on the electrical power line, the two or more electrical signals comprise continuous electrical noise;

converting the continuous electrical noise in the two or more electrical signals into one or more first data signals;

wirelessly transmitting the one or more first data signals to a computational unit;

before detecting an occurrence of one or more electrical events, wirelessly receiving the one or more first data signals at the computational unit;

detecting the occurrence of the one or more electrical events on the electrical power line using at least in part the continuous electrical noise in the two or more electrical signals; and associating the one or more electrical events with a change in an electrical state of at least one device of the one or more electrical devices, wherein:

the continuous electrical noise in the two or more electrical signals comprises electrical signals that are identifiable on the electrical power line for a length of time greater than one second.

15. The method of claim 14, wherein:
the continuous electrical noise in the two or more electrical signals comprises high-frequency electromagnetic interference in a range of thirty kilohertz to three megahertz.

16. The method of claim 14, wherein:
associating the one or more electrical events with the change in the electrical state comprises:
associating the one or more electrical events with the change in the electrical state of the at least one device of the one or more electrical devices from one of:
a power-off state to a power-on state; or
a power-on state to a power-off state.

17. The method of claim 14, wherein:
associating the one or more electrical events with the change in the electrical state comprises:
associating the one or more electrical events with the change in the electrical state of the at least one device of the one or more electrical devices from a first state providing a first electrical power to the at least one device of the one or more electrical devices to a second state providing a second electrical power to the at least one device of the one or more electrical devices;
the first electrical power is different from the second electrical power; and
the first electrical power and the second electrical power are not in a power-off state.

18. The method of claim 14, further comprising:
after capturing the two or more electrical signals and before detecting the occurrence of the one or more electrical events, using the continuous electrical noise in the two or more electrical signals to train a computational unit to associate the one or more electrical events with the electrical power usage by the at least one device of the one or more electrical devices.

19. The method of claim 14, further comprising:
coupling a sensing device to a wall outlet of a structure;
wherein:
the wall outlet is coupled to the electrical power line; and
capturing the two or more electrical signals comprises:
capturing the two or more electrical signals using the sensing device coupled to the wall outlet of the structure.

20. An electrical event detection device configured to detect two or more electrical events in a power line infrastructure of a structure, the electrical event detection device comprising:
a receiving module configured to receive and process one or more electrical signals, the one or more electrical signals comprise a high-frequency component, the receiving module comprising:
an electrical interface configured to couple to the power line infrastructure;
one or more filter circuits coupled to the electrical interface and configured to pass one or more portions of the one or more electrical signals; and
a converter module coupled to an output of the one or more filter circuits and configured to convert the one or more portions of the one or more electrical signals into one or more data signals, the one or more data signals comprise information regarding the high-frequency component of the one or more electrical signals; and
a processing module configured to run on a processor, the processing module comprising:
an event detection module configured to use the information regarding the high-frequency component of the one or more electrical signals to determine whether the two or more electrical events have occurred;
a classification module configured to classify the two or more electrical events; and
a training module configured to correlate a first type of event with a first event of the two or more electrical events and to correlate a second type of event with a second event of the two or more electrical events,
wherein:
the two or more electrical events comprise a turning on of one or more electrical devices coupled to the power line infrastructure of the structure and also comprise a turning off of the one or more electrical devices coupled to the power line infrastructure of the structure; and
the high-frequency component of the one or more electrical signals comprise electrical signals in a ten kilohertz to three megahertz range;
the high-frequency component of the one or more electrical signals further comprises substantially continuous electrical noise on the power line infrastructure; and
the substantially continuous electrical noise comprises (a) first electrical noise that is identifiable on the power line infrastructure for a first length of time that is greater than one alternating current electrical cycle, or (b) second electrical noise that is identifiable on the power line infrastructure for a second length of time that is less than one alternating current electrical cycle but the second electrical noise are repeated in three or more alternating current electrical cycles.

21. The electrical event detection device of claim 20, further comprising:
a hub electrically coupled to the power line infrastructure, wherein:
the hub is configured to receive the one or more data signals from the receiving module over the power line infrastructure.

22. The electrical event detection device of claim 21, wherein:
the hub is further configured to communicate the one or more data signals to the processing module over a wireless connection.

* * * * *